(12) United States Patent
Fukasawa et al.

(10) Patent No.: US 11,462,501 B2
(45) Date of Patent: Oct. 4, 2022

(54) INTERCONNECT SUBSTRATE AND METHOD OF MAKING THE SAME

(71) Applicant: SHINKO ELECTRIC INDUSTRIES CO., LTD., Nagano (JP)

(72) Inventors: Ryo Fukasawa, Nagano (JP); Tomoo Yamasaki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 140 days.

(21) Appl. No.: 17/076,063

(22) Filed: Oct. 21, 2020

(65) Prior Publication Data

US 2021/0125953 A1 Apr. 29, 2021

(30) Foreign Application Priority Data

Oct. 25, 2019 (JP) .............................. JP2019-194784
Oct. 15, 2020 (JP) .............................. JP2020-174190

(51) Int. Cl.
*H01L 23/00* (2006.01)

(52) U.S. Cl.
CPC .... *H01L 24/24* (2013.01); *H01L 2924/01028* (2013.01); *H01L 2924/01029* (2013.01)

(58) Field of Classification Search
CPC ........... H01L 24/24; H01L 2924/01028; H01L 29/01029
See application file for complete search history.

(56) References Cited

U.S. PATENT DOCUMENTS

| | | | | |
|---|---|---|---|---|
| 6,215,196 B1* | 4/2001 | Eldridge | ................. | H01L 24/11 257/784 |
| 8,089,148 B1* | 1/2012 | Lee | ......................... | H01L 24/83 257/E23.06 |
| 9,704,725 B1* | 7/2017 | Kim | ..................... | H01L 21/4842 |
| 10,181,449 B1* | 1/2019 | Chen | ......................... | H01L 24/24 |
| 2001/0051426 A1* | 12/2001 | Pozder | .................... | H01L 24/11 257/E21.582 |
| 2002/0187314 A1* | 12/2002 | Shibata | ..................... | B44C 1/20 428/195.1 |
| 2005/0258484 A1* | 11/2005 | Itou | ......................... | H01L 24/05 257/341 |
| 2009/0294932 A1* | 12/2009 | Sahasrabudhe | ... | H01L 23/49548 257/666 |
| 2010/0314728 A1* | 12/2010 | Li | ........................ | H01L 21/4832 438/123 |
| 2011/0001238 A1* | 1/2011 | Wakisaka | ................. | H01L 23/28 257/E21.507 |
| 2011/0006410 A1* | 1/2011 | Baba | ........................ | H01L 24/49 257/676 |
| 2011/0053319 A1* | 3/2011 | Hohlfeld | ............. | H01L 23/3735 257/E21.499 |

(Continued)

FOREIGN PATENT DOCUMENTS

JP 2010-192864 9/2010

*Primary Examiner* — Nathan W Ha
(74) *Attorney, Agent, or Firm* — IPUSA, PLLC

(57) ABSTRACT

An interconnect substrate includes an insulating layer and an interconnect layer formed on a surface of the insulating layer, wherein the surface of the insulating layer has grooves formed therein, the grooves having a meander shape on an order of nanometers in a plan view, and wherein the interconnect layer has anchor portions fitted into the grooves.

10 Claims, 28 Drawing Sheets

(56) References Cited

U.S. PATENT DOCUMENTS

| | | | |
|---|---|---|---|
| 2011/0074047 A1* | 3/2011 | Pendse | H01L 24/03 257/782 |
| 2012/0052628 A1* | 3/2012 | Kuroda | H01L 21/563 438/118 |
| 2012/0126401 A1* | 5/2012 | Lin | H01L 23/552 257/737 |
| 2012/0282737 A1* | 11/2012 | Tanoue | H01L 24/32 257/E21.506 |
| 2014/0167261 A1* | 6/2014 | Topacio | H01L 24/17 257/737 |
| 2016/0233179 A1* | 8/2016 | Huang | H01L 24/48 |
| 2016/0284588 A1* | 9/2016 | Yoshimochi | H01L 29/66734 |
| 2016/0284639 A1* | 9/2016 | Chen | H01L 24/02 |
| 2017/0170130 A1* | 6/2017 | Kaneda | H01L 25/105 |
| 2017/0278766 A1* | 9/2017 | Kim | H01L 23/5386 |
| 2017/0362469 A1* | 12/2017 | Sherman | B32B 7/06 |
| 2019/0181089 A1* | 6/2019 | Karino | H01L 24/49 |
| 2019/0295937 A1* | 9/2019 | Zhang | H01L 23/16 |
| 2020/0087558 A1* | 3/2020 | Yamashita | H01F 6/04 |
| 2021/0183785 A1* | 6/2021 | Kwon | H01L 24/20 |

\* cited by examiner 100 nm

SECOND DIRECTION

FIRST DIRECTION

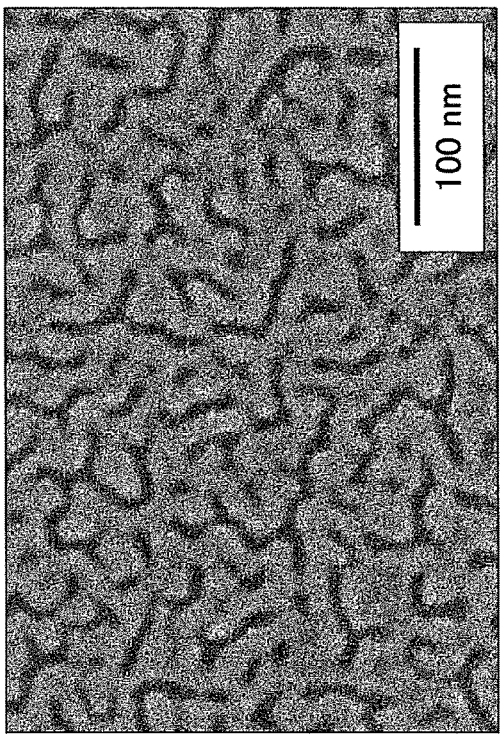
FIG.24B
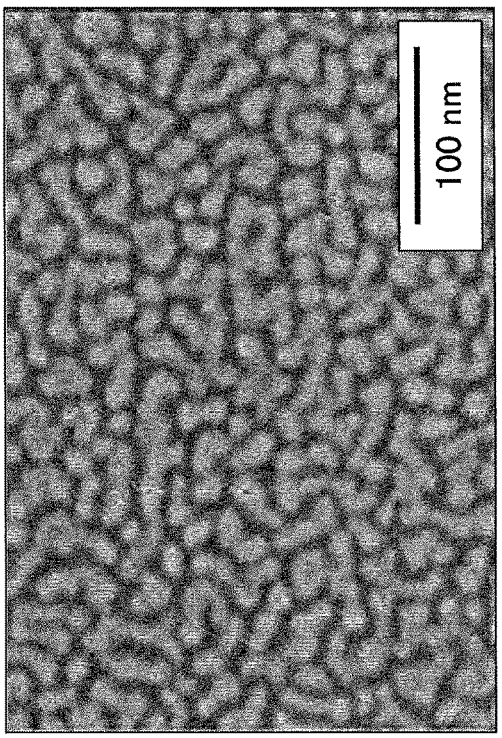
FIG.24D
FIG.24A
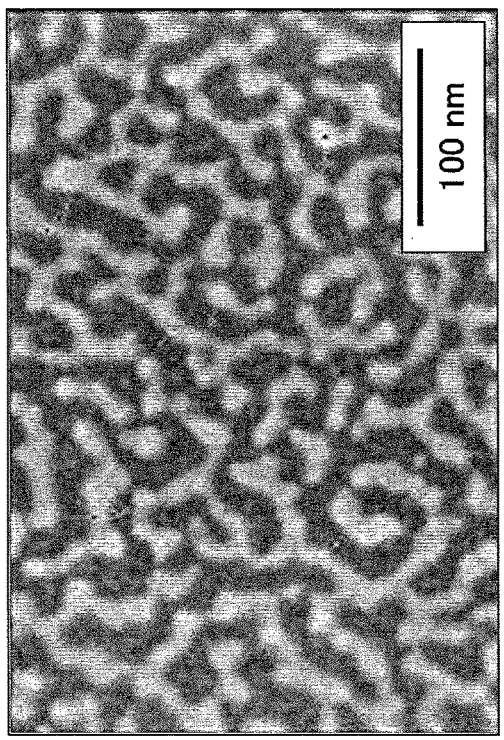
FIG.24C 100 nm 100 nm 100 nm 100 nm

INTERCONNECT SUBSTRATE AND METHOD OF MAKING THE SAME

CROSS-REFERENCE TO RELATED APPLICATIONS

The present application is based upon and claims priority to Japanese Patent Application No. 2019-194784 filed on Oct. 25, 2019 and Japanese Patent Application No. 2020-174190 filed on Oct. 15, 2020, with the Japanese Patent Office. The entire contents of these applications are incorporated herein by reference.

FIELD

The disclosures herein relate to an interconnect substrate and a method of making an interconnect substrate.

BACKGROUND

During the manufacture of an interconnect substrate, a desmearing process may be performed with respect to an insulating layer. The desmearing process creates surface irregularities on the order of micrometers in the surface of an insulating layer, which serves to improve adhesion between the insulating layer and an interconnect layer. In the presence of surface irregularities on the order of micrometers in the surface of an insulating layer, an increase in the speed of signal transmission causes the path of signal transmission to be elongated due to a skin effect, thereby causing an increase in transmission loss.

A technique aimed at improving adhesion between an insulating layer and an interconnect layer while avoiding an increase in transmission loss is disclosed in Patent Document 1. There is also a technique known in the art that improves adhesion between an insulating layer and an interconnect layer by forming a primer layer on the surface of the insulating layer.

The technique disclosed in Patent Document 1 achieves the desired objective, but may fail to provide sufficient adhesion in some cases. Further, the technique that uses a primer layer is applicable only to a limited range of materials, and thus has low applicability.

[Patent Document 1] Japanese Laid-open Patent Publication No. 2010-192864

SUMMARY

According to an aspect of the embodiment, an interconnect substrate includes an insulating layer and an interconnect layer formed on a surface of the insulating layer, wherein the surface of the insulating layer has grooves formed therein, the grooves having a meander shape on an order of nanometers in a plan view, and wherein the interconnect layer has anchor portions fitted into the grooves.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 24A through 24D are drawings illustrating examples of images of an insulating layer surface obtained by a scanning electron microscope;

DESCRIPTION OF EMBODIMENTS

In the following, the embodiments will be described with reference to the accompanying drawings. In the specification and drawings, elements having substantially the same functions or configurations are referred to by the same numerals, and a duplicate description thereof may be omitted. Some of the drawings may illustrate a characteristic portion in an enlarged view in order to provide a clearer view of features for the sake of convenience. Dimensions and proportions of illustrated parts are not necessarily the same as the life-size parts. In the present disclosures, a "plan view" refers to a view of an object as taken in the vertical direction of a figure such as FIG. 2 (i.e., the up-down direction in the figure). A "plan shape" refers to the shape of an object as appears when viewed in the vertical direction, such as the one illustrated in FIG. 1 or the like <Grooves>

In the present disclosures, a long, thin recess formed in the surface of a layer or a film is referred to as a groove when the length of the plan shape of the recess is more than twice (i.e., more than 2.0 times larger than) the average width of the recess.

Figure 1:
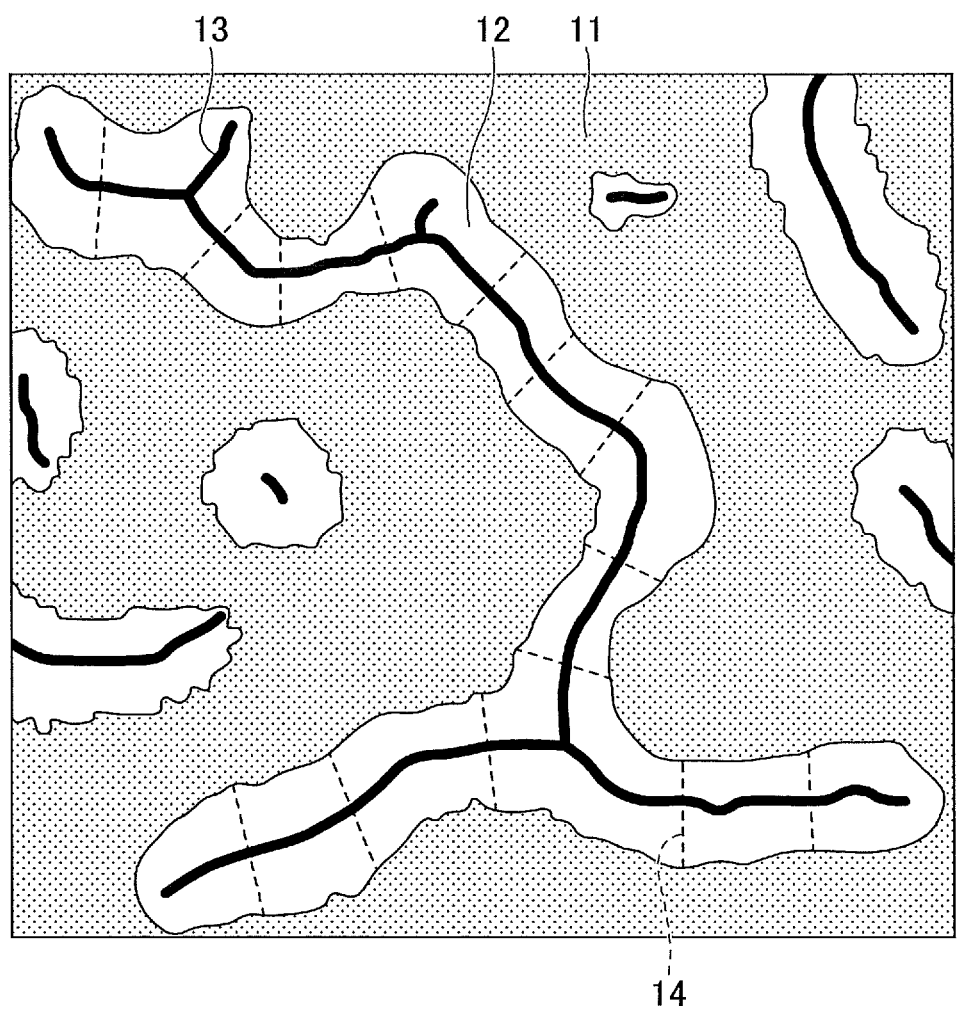
FIG. 1 is a plan view illustrating an example of grooves.

A recess 12 illustrated in FIG. 1 is formed in a surface 11 of a layer. It is possible to define a medial axis (MA) 13 with respect to the recess 12. The recess 12 may have a branch. In the present disclosures, the total length of the medial axis 13 inclusive of the branch portions is defined as the length of the recess 12.

A portion of a straight line perpendicular to the medial axis 13 is a line segment 14 connecting the two intersection points between the straight line and the contour of the recess 12, and the length of the line segment 14 is defined as the width of the recess 12 at the intersection point between the medial axis 13 and the line segment 14. As the spacing between line segments 14 on the medial axis 13 is made infinitesimally small, the average length of the infinite number of such line segments 14 becomes substantially equal to the value obtained by dividing the area of the recess 12 in a plan view by the total length of the medial axis 13, i.e., the length of the recess 12. In the present disclosures, the value obtained by dividing the area of the recess 12 by the total length of the medial axis 13, i.e., the length of the recess 12, is defined as the average width of the recess 12.

In the case of an opening formed in the surface of a layer or a film, a long, thin opening is referred to as a groove opening when the length of the plan shape of the opening is more than twice (i.e., more than 2.0 times larger than) the average width of the opening.

First Embodiment

A first embodiment will be described. The first embodiment is directed to an interconnect substrate including a core substrate. [Structure of Interconnect Substrate]

Figure 2:
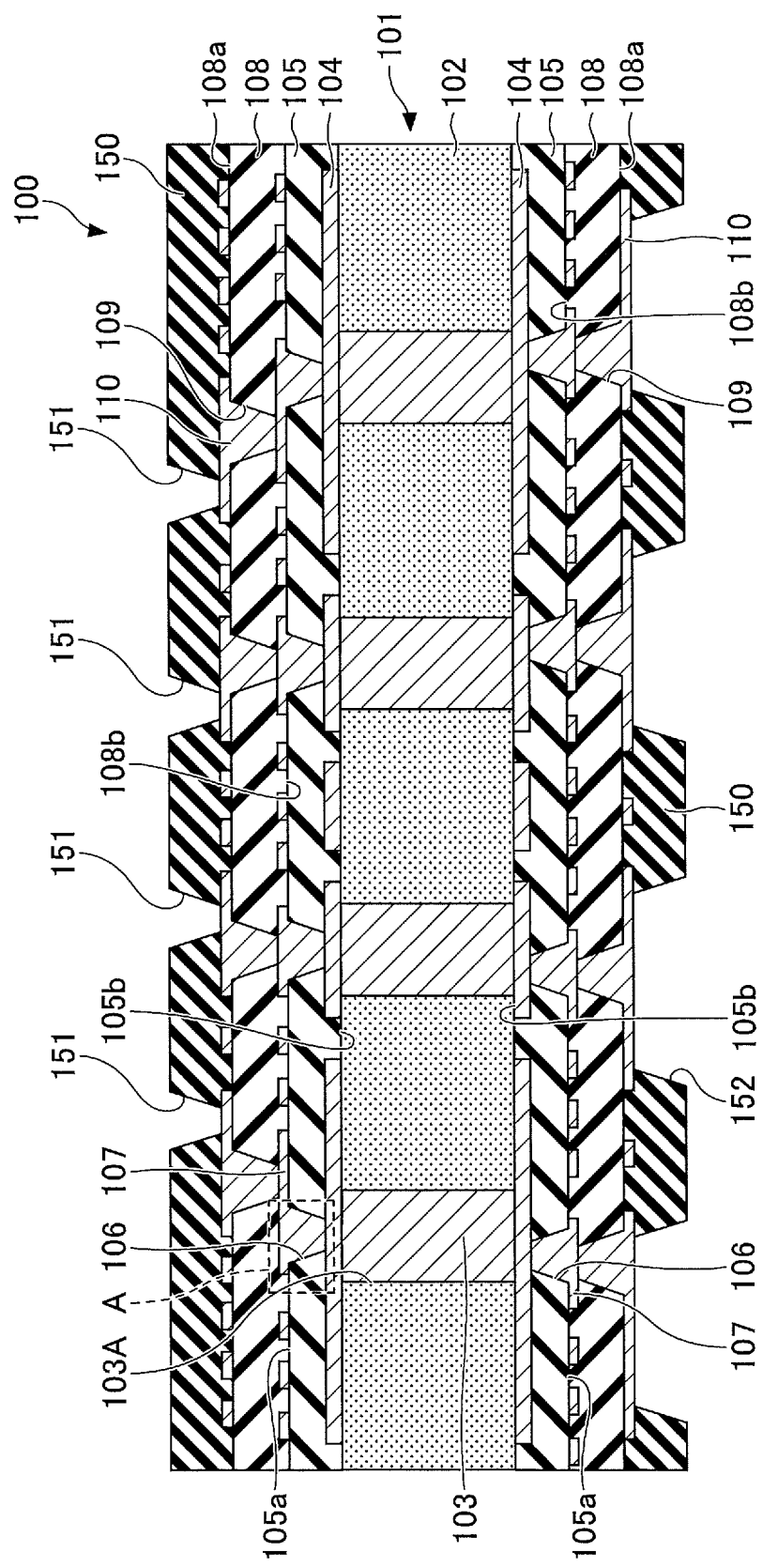
FIG. 2 is a cross-sectional view illustrating an example of the structure of an interconnect substrate according to a first embodiment.

In the following, the structure of an interconnect substrate will be described. FIG. 2 is a cross-sectional view illustrating an example of the structure of an interconnect substrate according to a first embodiment;

As illustrated in FIG. 2, an interconnect substrate 100 of the first embodiment includes a core interconnect substrate 101 serving as a support member. The core interconnect substrate 101 includes a core substrate 102 made of an insulating material such as a glass epoxy resin or a bismaleimide triazine resin. First interconnect layers 104 made of copper or the like are formed on the respective surfaces of the core substrate 102. The core substrate 102 has the through-holes 103A penetrating therethrough in the thickness direction. The through-holes 103A have the penetrating conductors 103 therein. The first interconnect layers 104 on the respective surfaces of the core substrate 102 are coupled to each other through the penetrating conductors 103. Alternatively, a through-hole plating layer may be formed on the sidewalls of the through-holes 103A, with the remaining space of the through-holes 103A being filled with a resin member. In this case, the first interconnect layers 104 on the respective surfaces of the core substrate 102 are coupled to each other through the through-hole plating layer.

First insulating layers 105 are formed over and under the core substrate 102. The first insulating layers 105 each have a surface 105a opposite from the core substrate 102 and a surface 105b facing toward the core substrate 102. The first insulating layers 105 have via holes 106 in contact with the first interconnect layers 104. Second interconnect layers 107 are disposed on the first insulating layers 105 to be coupled to the first interconnect layers 104 through via conductors inside the via holes 106. Further, second insulating layers 108 are disposed on the first insulating layers 105 over and under the core substrate 102. The second insulating layers 108 each have a surface 108a opposite from the core substrate 102 and a surface 108b facing toward the core substrate 102. The second insulating layers 108 have via holes 109 in contact with the second interconnect layers 107. Third interconnect layers 110 are disposed on the second insulating layers 108 to be coupled to the second interconnect layers 107 through via conductors inside the via holes 109.

Solder resist layers 150 are disposed on the second insulating layers 108 over and under the core substrate 102. The solder resist layer 150 disposed over the core substrate 102 at the position to be connected to a semiconductor chip has openings 151 that extend to, and are in contact with, the upper third interconnect layer 110. The solder resist layer 150 disposed under the core substrate 102 has openings 152 that extend to, and are in contact with, the lower third interconnect layer 110.

Figure 3:
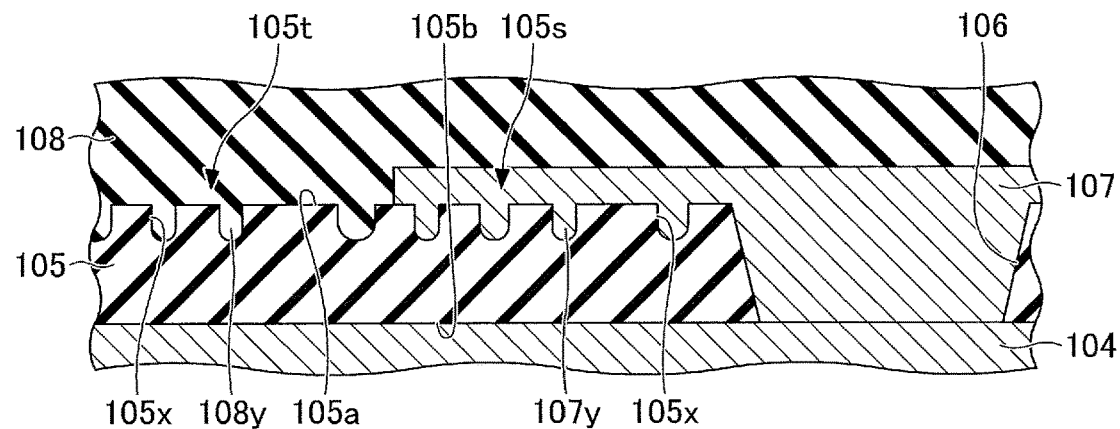
FIG. 3 is a cross-sectional view illustrating an example of the structure of an interconnect substrate according to a first embodiment.
Figure 4:
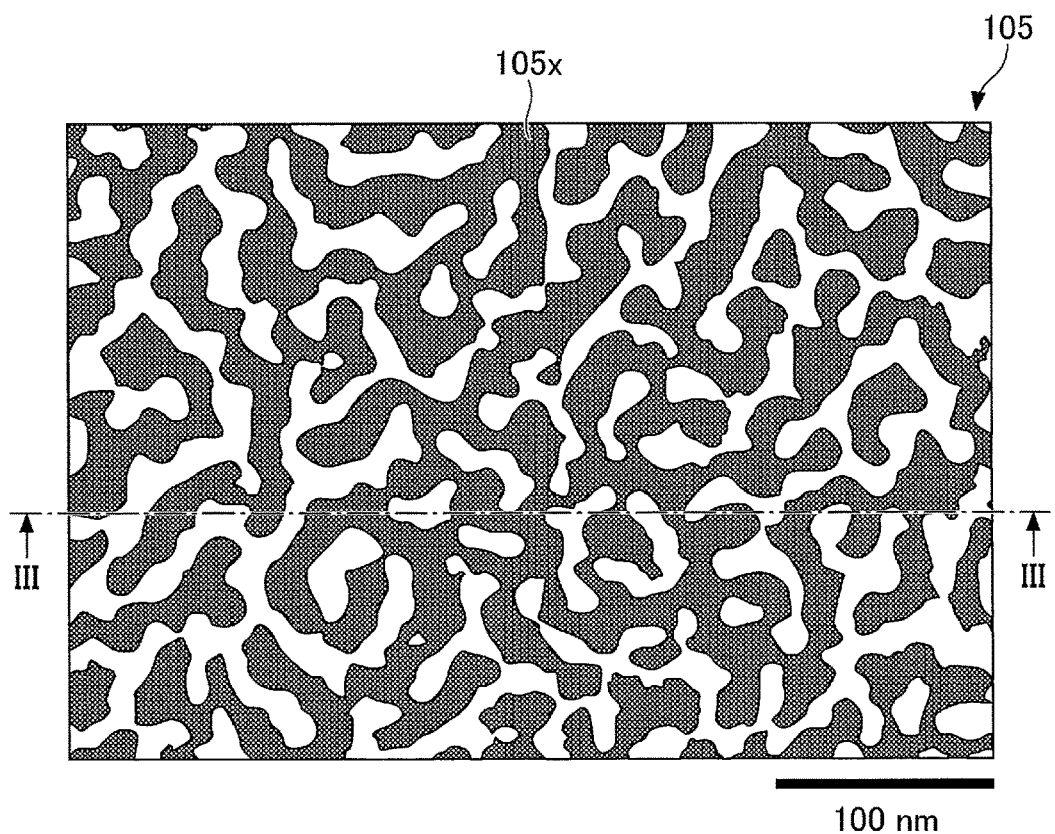
FIG. 4 is a plan view illustrating an example of a surface of an insulating layer according to the first embodiment.

In the following, the structures of the first insulating layer 105 and the second interconnect layer 107 will be described in detail. FIG. 3 is a cross-sectional view illustrating an example of the structure of an interconnect substrate according to the first embodiment. FIG. 3 provides an enlarged view of a portion A illustrated in FIG. 2. FIG. 4 is a plan view illustrating an example of the surface 105a of the first insulating layer 105 according to the first embodiment. A cross-section taken along the line III-III in FIG. 4 is illustrated in FIG. 3.

As illustrated in FIG. 3 through FIG. 4, the surface 105a of the first insulating layer 105 has a plurality of grooves 105x. The grooves 105x have a meander shape in a plan view. Namely, the grooves 105x have portions that meander in a plan view. In the present disclosures, a meander-shape groove (or recess) refers to a groove (or recess) that travels in random directions without directivity. The meander shape includes a mesh shape, a maze shape, and the like. The grooves 105x are on the order of nanometers. The average width of the grooves 105x is greater than or equal to 1 nm and less than 100 nm, and is preferably greater than or equal to 3 nm and less than or equal to 50 nm. It may be noted that the width of the grooves 105x varies depending on the position. This is because the grooves 105x have a meander shape. Although the appearance of the grooves 105x varies depending on the position of an observed cross-section, the width of the grooves 105x is largely equal in a plan view, as illustrated in FIG. 4, The surface 105a includes a covered area 105s covered with the second interconnect layer 107, and includes an exposed area 105d not covered with the second interconnect layer 107. The grooves 105x are formed in both the covered area 105s and the exposed area 105t. The second interconnect layer 107 has anchor portions 107y fitted into the grooves 105x, and is in direct contact with the covered area 105s. The second insulating layer 108 has anchor portions 108y fitted into the grooves 105x, and is in direct contact with the exposed area 105t.

Although not shown, the surface 108a of the second insulating layer 108 has grooves formed therein similar to the grooves 105x. The third interconnect layer 110 has anchor portions fitted into the grooves formed in the surface 108a. The solder resist layer 150 has anchor portions fitted into the grooves formed in the surface 108a.

The first interconnect layer 104, the second interconnect layer 107, and the third interconnect layer 110 are conductive layers inclusive of a copper layer or the like, for example. The first insulating layer 105 and the second insulating layer 108 are resin layers containing an insulating resin such as an epoxy resin or a polyimide resin, for example. The first insulating layer 105 and the second insulating layer 108 may contain a filler such as silica.

In the first embodiment, the grooves 105x are formed in the surface 105a, and the second interconnect layer 107 has the anchor portions 107y fitted into the grooves 105x, so that adhesion between the first insulating layer 105 and the second interconnect layer 107 may be improved.

The grooves 105x having a meander shape fill the entire surface area at high density. The anchor portions 107y fitted into the grooves 105x have a root-like structure that has effectively long extensions spreading in random directions (i.e., all directions) in the plane. Due to this arrangement, stress is distributed in all directions even when locally applied to an area of the second interconnect layer 107 where the anchor portions 107y are situated. The anchor portions 107y are thus not readily broken, which ensures excellent adhesion. In the case of recesses having a pinhole shape, for example, the anchor portions would have a pile-like shape. As the pile diameters become nano size, the breaking strength of the anchor portions decreases, resulting in the anchor portions being easily broken when stress is concentrated. In the case of grooves having a straight line shape, the anchor portions would have a long extended shape as in the present disclosures, so that stress would be dispersed. However, the breaking strength could have direction dependency within the plane.

Grooves similar to the grooves 105x are formed in the surface 108a of the second insulating layer 108, and the third interconnect layer 110 has anchor portions fitted into the grooves formed in the surface 108a, so that adhesion between the second insulating layer 108 and the third interconnect layer 110 may also be improved.

The grooves 105x are formed in the surface 105a, and the second insulating layer 108 has the anchor portions 108y fitted into the grooves 105x, so that adhesion between the first insulating layer 105 and the second insulating layer 108 may also be improved.

Because the grooves 105x are on the order of nanometers, an increase in the length of signal transmission paths is reduced, which ensures that satisfactory transmission characteristics are provided with respect to radio-frequency signals.

At the position to be connected to the semiconductor chip over the core substrate 102, connection terminals may be disposed on the upper third interconnect layer 110 to extend through the openings 151 and protrude upwardly from the upper solder resist layer 150.

[Method of Making Interconnect Substrate]

In the following, a method of making the interconnect substrate will be described. FIGS. 5A and 5B through FIGS. 7A and 7B are cross-sectional views illustrating an example of a method of making the interconnect substrate according to the first embodiment.

Figure 5A:
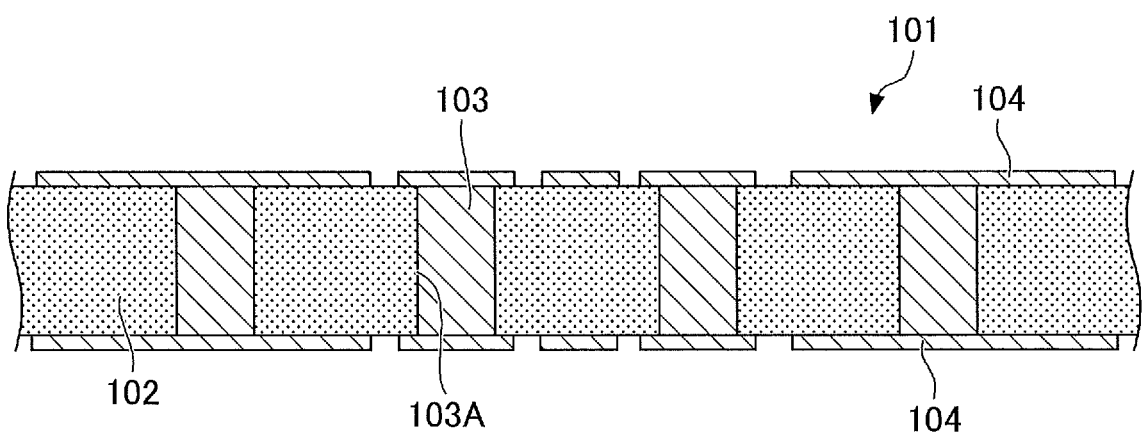
FIGS. 5A and 5B are cross-sectional views illustrating the method of making the interconnect substrate according to the first embodiment.

As illustrated in FIG. 5A, the core interconnect substrate 101 is provided as a supporting member. The core interconnect substrate 101 includes the core substrate 102 and the first interconnect layers 104. The core substrate 102 has the through-holes 103A penetrating therethrough in the thickness direction. The through-holes 103A have the penetrating conductors 103 therein. The through-holes 103A may be formed by a process using a drill or a laser beam, for example. The penetrating conductors 103 and the first interconnect layers 104 may be formed by plating and photolithography or the like, for example. The core interconnect substrate 101 is a large-size substrate from which a plurality of interconnect substrates 100 may be produced. Namely, the core interconnect substrate 101 includes a plurality of areas, in each of which a structure corresponding to the interconnect substrate 100 is formed.

Figure 5B:
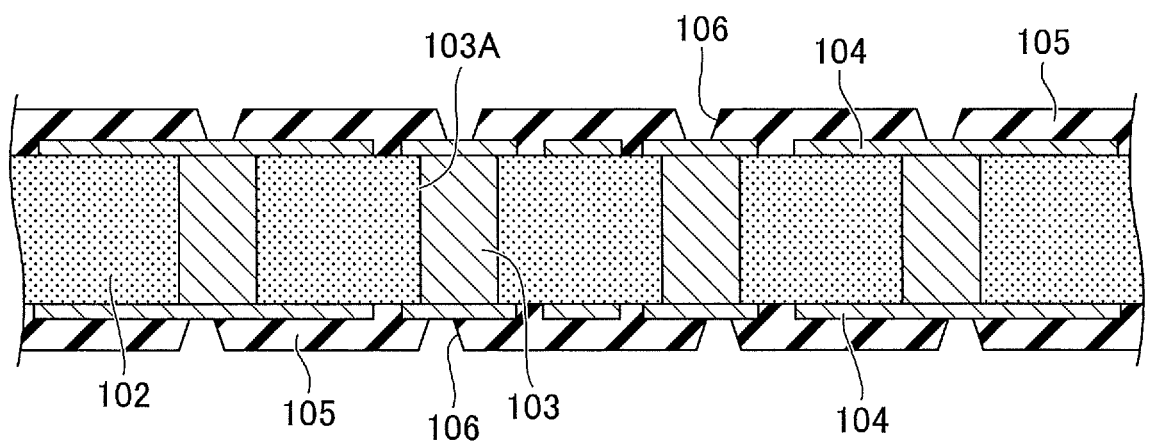

As illustrated in FIG. 5B, uncured resin films, which are attached to the respective surfaces of the core substrate 102, are heated and cured to turn into the first insulating layers 105. The first insulating layers 105 are made of an insulating resin such as an epoxy resin or a polyimide resin. Alternatively, a liquid resin may be applied to form the first insulating layers 105. Subsequently, the first insulating layers 105 on the respective surfaces of the core substrate 102 are processed by a laser, which produces, through the first insulating layers 105, the via holes 106 that extend to, and are in contact with, the respective first interconnect layers 104.

Figure 6A:
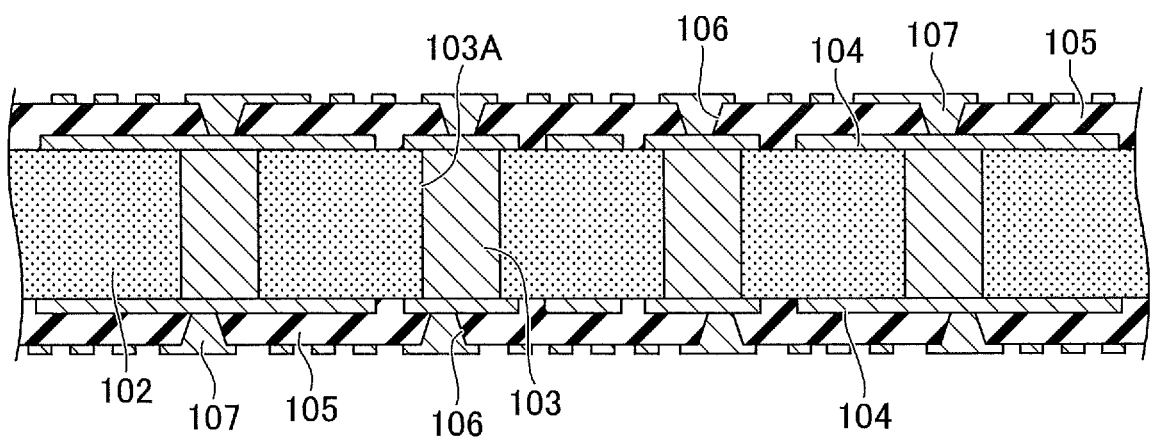
FIGS. 6A and 6B are cross-sectional views illustrating the method of making the interconnect substrate according to the first embodiment.

As illustrated in FIG. 6A, the second interconnect layers 107 are formed on the respective first insulating layers 105 over and under the core substrate 102, and are connected to the respective first interconnect layers 104 through the via conductors inside the via holes 106.

Figure 6B:
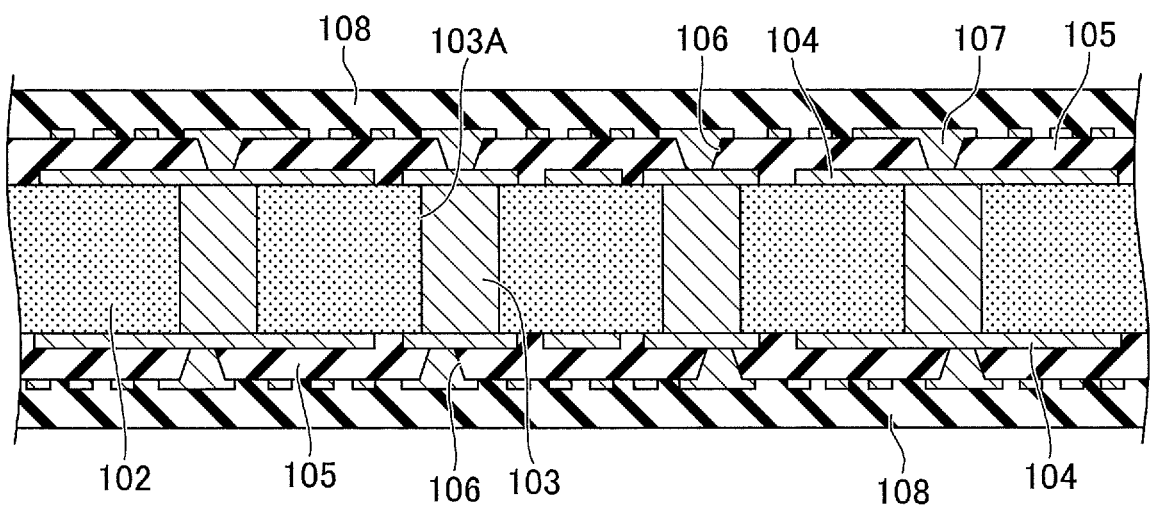

As illustrated in FIG. 6B, the second insulating layers 108 are formed on the respective first insulating layers 105 over and under the core substrate 102. The second insulating layers 108 may be formed similarly to the manner in which the first insulating layers 105 are formed.

The method of forming the second interconnect layers 107 and the second insulating layers 108 will be described in detail. The second interconnect layers 107 may be formed by a semi-additive process. FIGS. 8A to 8C through FIGS. 10A to 10C are cross-sectional views illustrating an example of the method of forming the second interconnect layer 107 and the second insulating layer 108 according to the first embodiment. FIGS. 8A to 8C through FIGS. 10A to 10C illustrate the same portion as illustrated in FIG. 3.

Figure 8A:
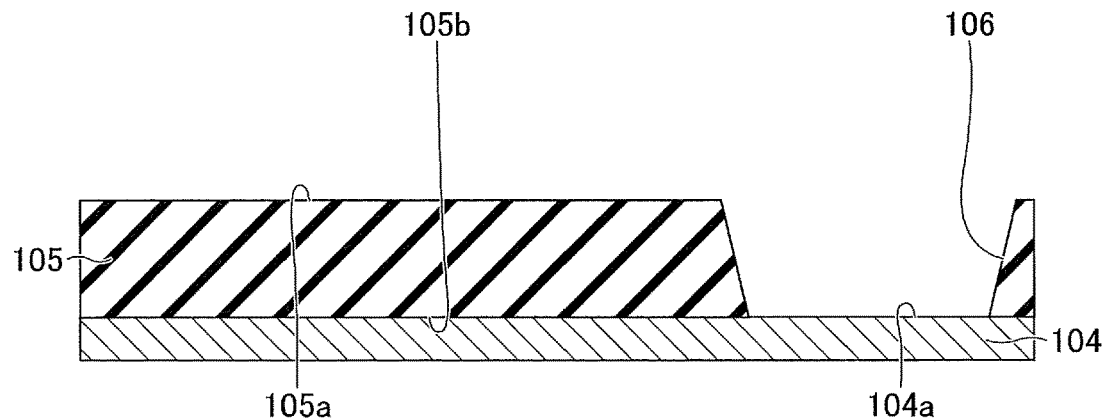
FIGS. 8A through 8C are cross-sectional views illustrating an example of the method of forming the interconnect layer and the insulating layer according to the first embodiment.

As was previously described, the via hole 106 that extends to, and is in contact with, the first interconnect layer 104 is formed through the first insulating layer 105 (see FIG. 8A). Subsequently, the surface 105a of the first insulating layer 105, the side surface of the via hole 106, and the surface 104a of the first interconnect layer 104 exposed through the via hole 106 are cleaned. In this cleaning, plasma etching in inverse sputtering is performed in a sputtering apparatus, for example. Argon gas or nitrogen gas may be used as a process gas in the plasma etching, for example. A mixed gas of argon gas and nitrogen gas may alternatively be used as the process gas. Plasma etching may also be performed prior to cleaning, thereby removing a residual insulating resin (i.e., smear) from the bottom of the via hole 106. In this plasma etching, a tetrafluoromethane gas, an oxygen gas, a nitrogen gas, an argon gas, or a mixed gas thereof may be used as a process gas, for example.

Figure 8B:
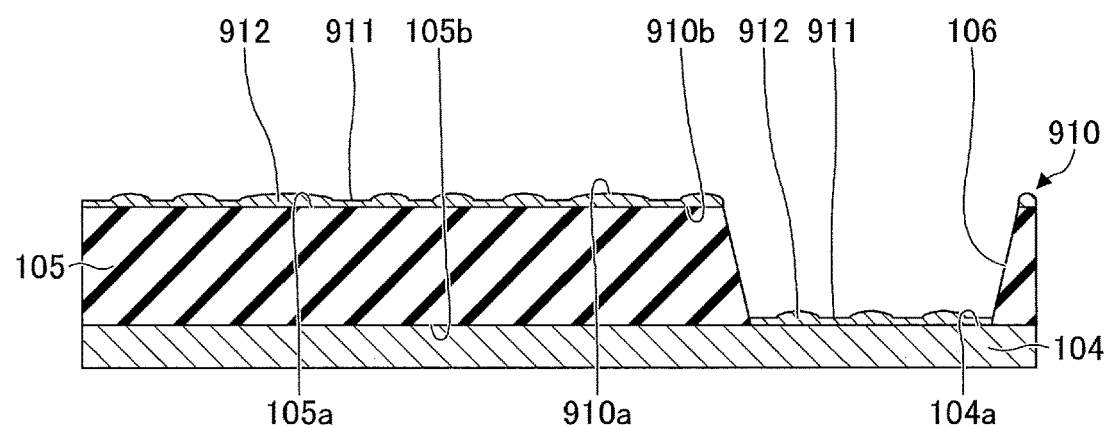
Figure 11:
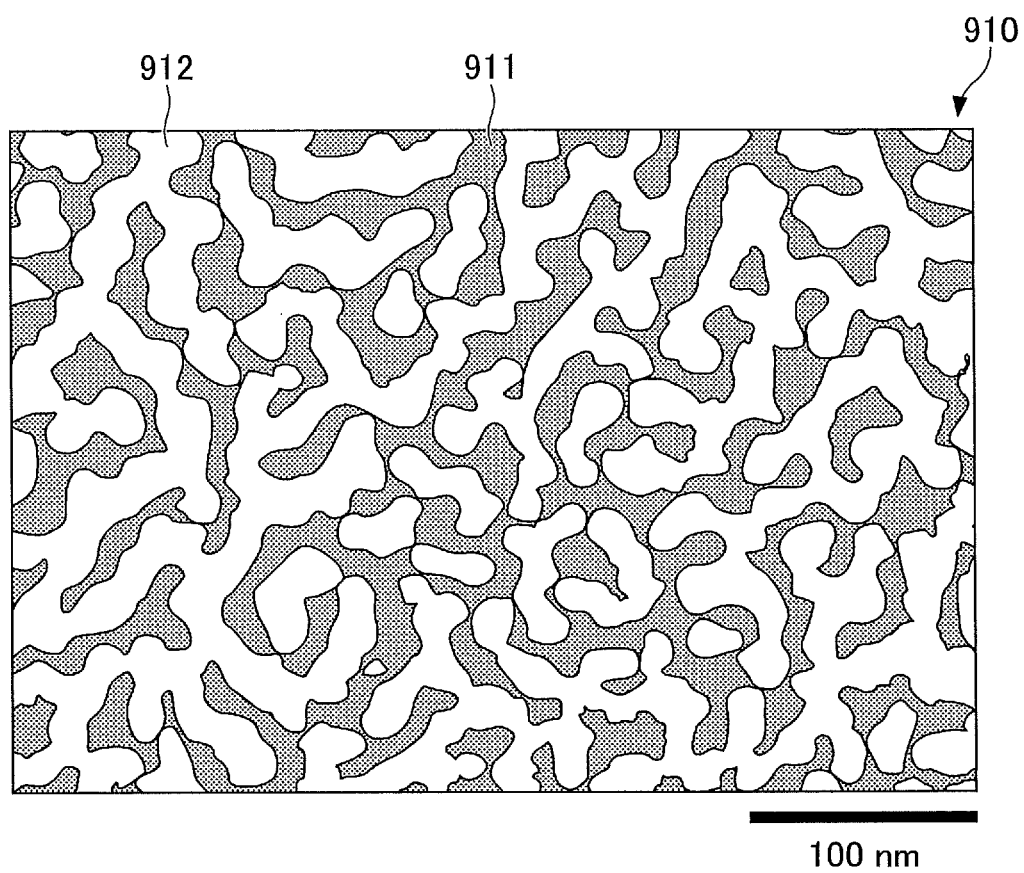
FIG. 11 is a plan view illustrating an example of a masking film.

Subsequently, as illustrated in FIG. 8B, a masking film 910 having recesses 911 and bulges 912 is formed on the surface 105a and the exposed surface 104a. The masking film 910 has a surface 910a opposite from the core substrate 102 and a surface 910b facing toward the core substrate 102. FIG. 11 is a plan view illustrating an example of the masking film 910. A copper film may be used as the masking film 910, for example. The masking film 910 may be formed by sputtering in the sputtering apparatus used for cleaning, for example. Namely, the structure illustrated in FIG. 8A may be left to stay in the sputtering apparatus after the cleaning, followed by forming the masking film 910. A film made of aluminum, zinc, tin, titanium, nickel, or a copper nickel alloy may be used as the masking film 910, for example. The surface 105a is an example of a first surface.

The average thickness of the masking film 910 may approximately be 5 nanometers to 15 micrometers, for example. In the case of using a sputtering process to form the masking film 910, a material for the masking film 910 is selected and film formation conditions are adjusted, such that nucleus growth occurs to form the film. As a material for the masking film 910, a metal having a melting point less than or equal to 1100 degrees Celsius, such as copper, aluminum, zinc, or the like, is preferably used. During the initial stage of growth, nucleation of the masking film 910 occurs at multiple locations on the surface 105a and the exposed surface 104a. Nuclei then grow, and are consolidated into the masking film 910 covering the entirety of the surface 105a and the exposed surface 104a. When the average thickness of the masking film 910 reaches approximately 5 nm to 15 nm, the consolidation of nuclei is already complete, with the masking films 910 covering the surface 105a and the exposed surface 104a. However, there is still variation in the thickness of the masking film 910. The masking film 910 has the recesses 911 and the bulges 912 due to this thickness variation. Because nucleation and consolidation of nuclei occur in an irregular manner, the recesses 911 and the bulges 912 are also formed in an irregular manner. The recesses 911 thus have a meander shape in a plan view as illustrated in FIG. 11. Namely, the recesses 911 have portions that meander in a plan view. The recesses 911 are on the order of nanometers. Namely, the average width of the recesses 911 is greater than or equal to 1 nm and less than 100 nm, and is preferably greater than or equal to 3 nm and less than or equal to 50 nm. The surface 910a is an example of a second surface, and the recesses 911 are an example of first grooves.

The lower the melting point of the material for the masking film is, the more likely it is for nuclei to grow large through aggregation during film formation, and the more likely it is for the recesses 911 and the bulges 912 to have large pitch. The melting point of aluminum and zinc is lower than the melting point of copper. Because of this, use of aluminum or zinc for the masking film 910 makes it easier to provide the recesses 911 and the bulges 912 having large pitch than in the case of using copper for the masking film 910. Providing the recesses 911 and the bulges 912 having large pitch allows a seed layer to be readily fit into the grooves 105x that will subsequently be formed (see FIG. 9B).

Figure 8C:
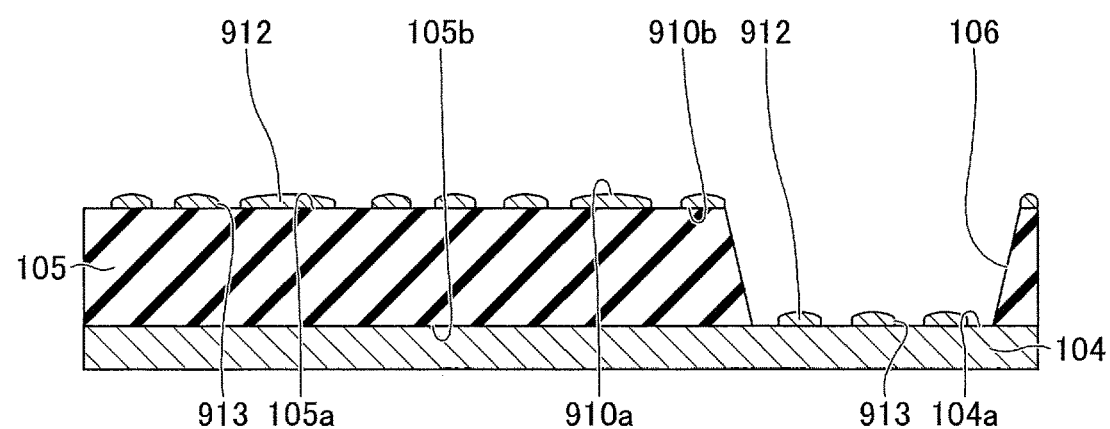
Figure 12:
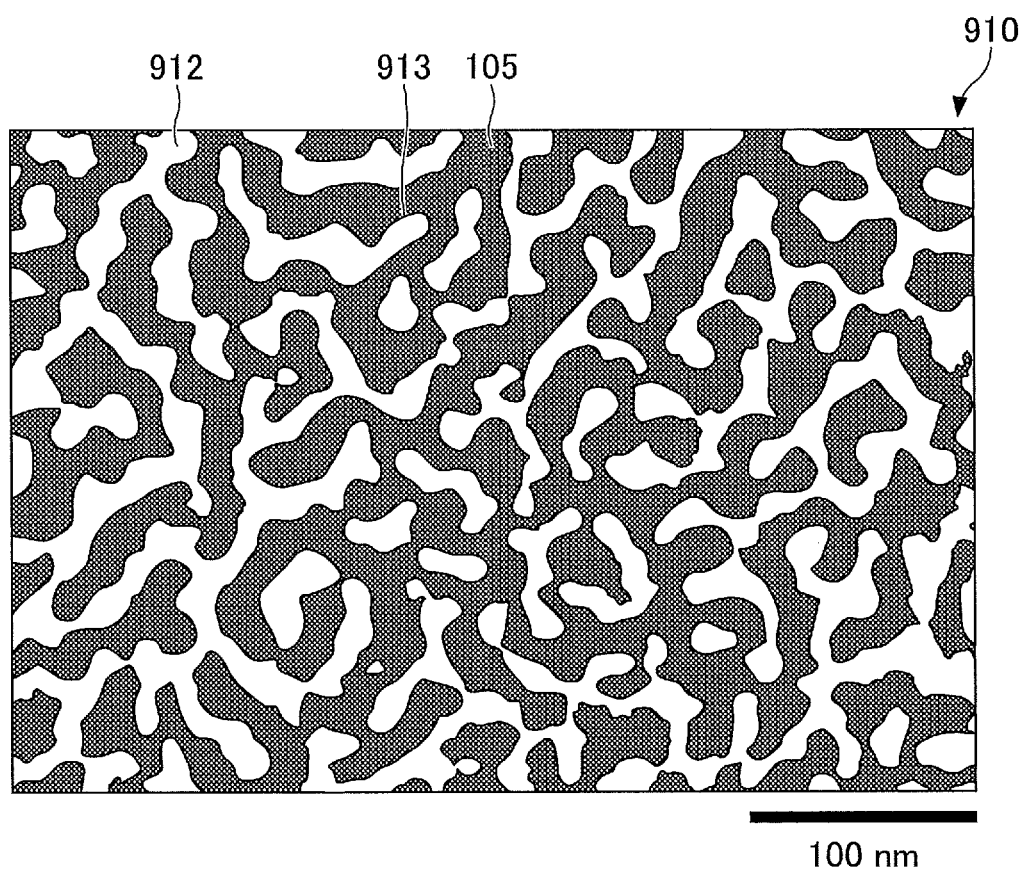
FIG. 12 is a plan view illustrating an example of the masking film.

After forming the masking film 910, the recesses 911 are deepened to form groove-shape openings 913 reaching all the way to the first insulating layer 105, as illustrated in FIG. 8C. Some openings may exist in the masking film 910 even before the above-noted deepening process. Without this process, however, a sufficient amount of openings 913 may not be present in the masking film 910, which makes it difficult to etch the first insulating layer 105 sufficiently in the subsequent process (see FIG. 9A). The openings 913 may be formed in the sputtering apparatus used for forming the masking film 910, for example. In forming the openings 913, plasma etching in inverse sputtering is performed in the sputtering apparatus, for example. Namely, the structure illustrated in FIG. 8B may be left to stay in the sputtering apparatus after forming the masking film 910, followed by forming the openings 913. Argon gas may be used as a process gas in the plasma etching, for example. Use of argon gas enables the etching rate of the metal masking film 910 to be increased, thereby shortening the time required for etching, and also reducing the deformation of the mask resulting from heat during plasma etching. During the formation of the openings 913, the recesses 911 expand in addition to being deepened, and the bulges 912 are lowered and narrowed. FIG. 12 is a plan view illustrating an example of the masking film 910. FIG. 11 previously described illustrates an example of the masking film 910 as appears prior to the formation of the openings 913. FIG. 12 illustrates an example of the masking film 910 as appears after the formation of the openings 913. The openings 913 are on the order of nanometers. Namely, the average width of the openings 913 is greater than or equal to 1 nm and less than 100 nm, and is preferably greater than or equal to 3 nm and less than or equal to 50 nm.

Figure 9A:
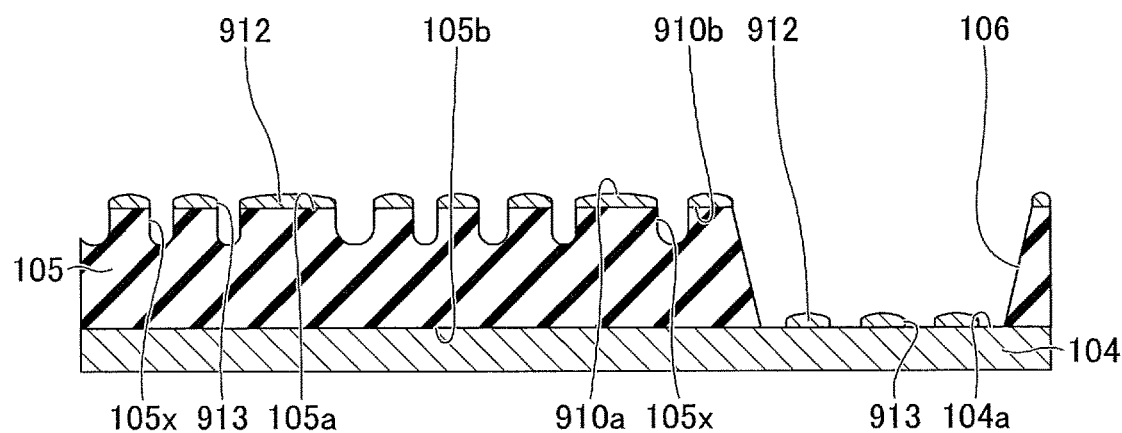
FIGS. 9A through 9C are cross-sectional views illustrating an example of the method of forming the interconnect layer and the insulating layer according to the first embodiment.

Subsequently, as illustrated in FIG. 9A, the grooves 105x matching the openings 913 in a plan view are formed in the surface 105a. The grooves 105x may be formed in the sputtering apparatus used for forming the openings 913, for example. In forming the grooves 105x, plasma etching in inverse sputtering is performed in the sputtering apparatus, for example. Namely, the structure illustrated in FIG. 8C may be left to stay in the sputtering apparatus after forming the openings 913, followed by forming the grooves 105x. Oxygen gas may be used as a process gas in the plasma etching, for example. Nitrogen gas or carbon tetrafluoride gas may alternatively be used as the process gas. Two or three of oxygen gas, nitrogen gas, and carbon tetrafluoride gas may be mixed, and such a mixed gas may alternatively be used as the process gas. The grooves 105x are on the order of nanometers. The average width of the grooves 105*x* is greater than or equal to 1 nm and less than 100 nm, and is preferably greater than or equal to 3 nm and less than or equal to 50 nm. The grooves 105*x* are an example of second grooves.

Figure 9B:
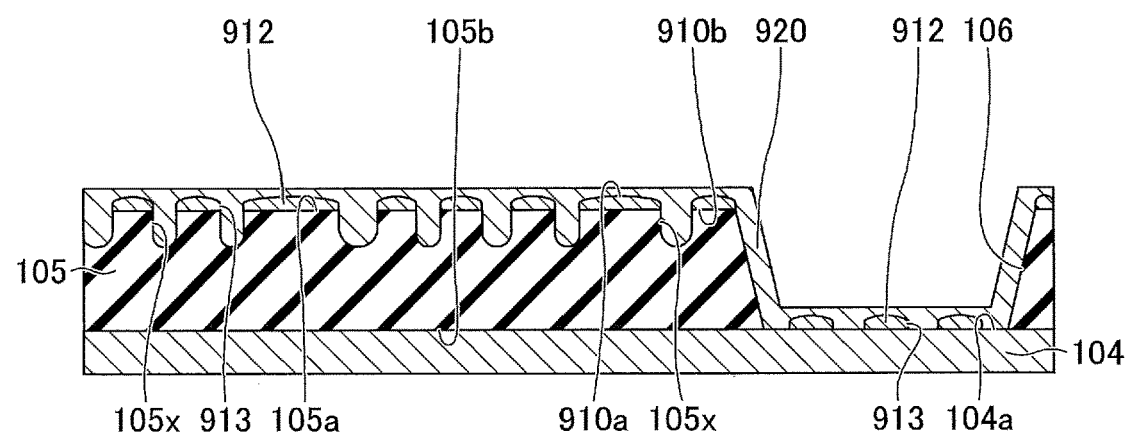

Subsequently, as illustrated in FIG. 9B, a seed layer 920 is formed on the first insulating layer 105 and on the inner surface of the via hole 106. Portions of the seed layer 920 are fitted into the grooves 105*x*, so that the grooves 105*x* are filled with the seed layer 920. The seed layer 920 may be formed in the sputtering apparatus used for forming the grooves 105*x*, for example. Namely, the structure illustrated in FIG. 9A may be left to stay in the sputtering apparatus after forming the grooves 105*x*, followed by forming the seed layer 920. A copper nickel alloy layer may be used as the seed layer 920, for example. The copper nickel alloy layer has excellent corrosion resistance and oxidation resistance. The copper nickel alloy layer having a nickel content of 20 mass % or more and 50 mass % or less can be removed in a subsequent process by using an etchant for copper. In forming the seed layer 920, a bias voltage is preferably applied to the core substrate 102. This is because such an arrangement allows the seed layer 920 to easily fit into the grooves 105*x*. The seed layer 920 may alternatively be formed by electroless plating after unloading the structure illustrated in FIG. 9A from the sputtering apparatus. A copper layer may alternatively be formed as the seed layer 920.

Figure 9C:
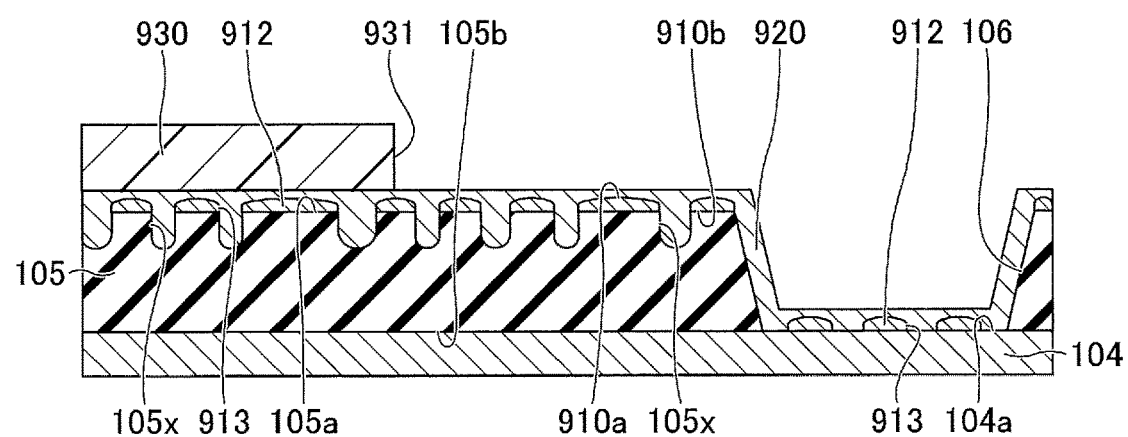

Subsequently, as illustrated in FIG. 9C, a plating resist layer 930 is formed that has an opening 931 in the place where the second interconnect layer 107 is to be formed. The plating resist layer 930 may be formed outside the sputtering apparatus used for forming the grooves 105*x*, for example.

Figure 10A:
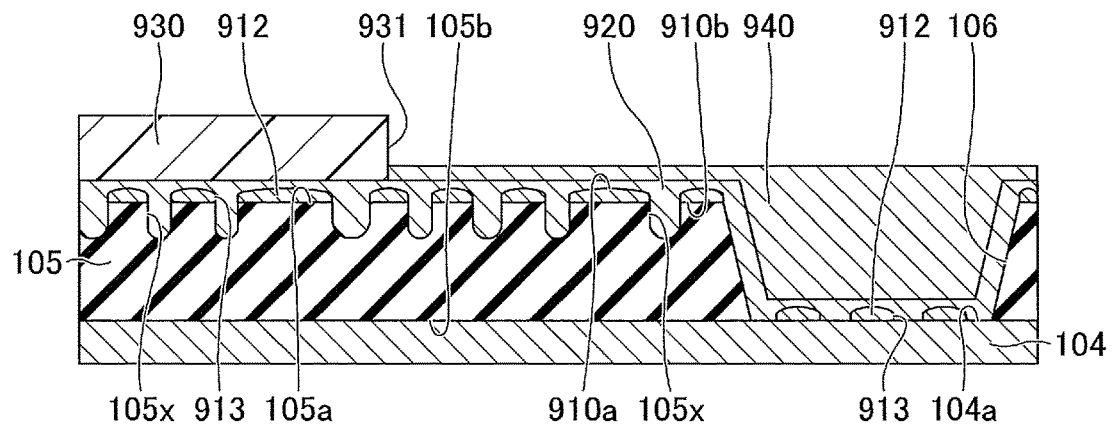
FIGS. 10A through 10C are cross-sectional views illustrating an example of the method of forming the interconnect layer and the insulating layer according to the first embodiment.

As illustrated in FIG. 10A, electroplating that utilizes the seed layer 920 as a plating-power feeding path is performed to form a metal plating layer 940 in the opening 931 of the plating resist layer 930.

Figure 10B:
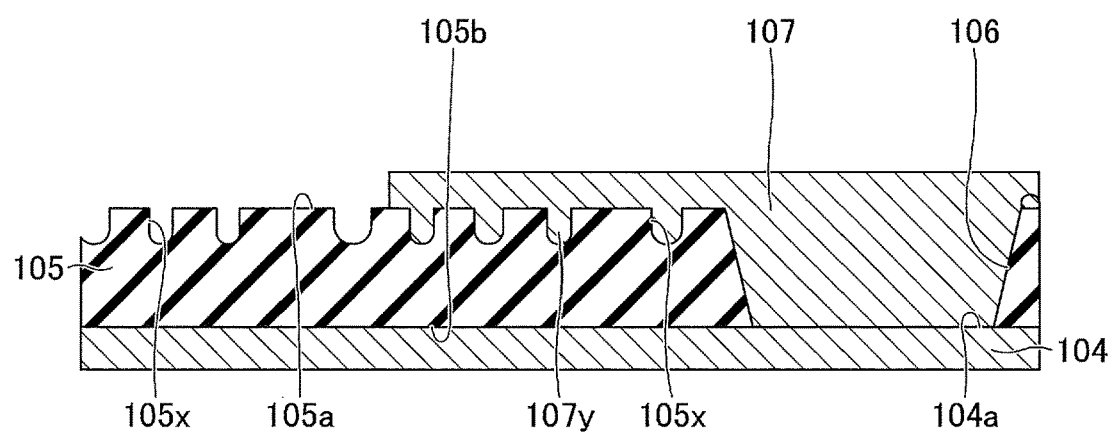

After this, as illustrated in FIG. 10B, the plating resist layer 930 is removed. The seed layer 920 and the masking film 910 are then removed by wet etching, which utilizes the metal plating layer 940 as a mask. In this manner, the second interconnect layer 107, which includes the seed layer 920 and the metal plating layer 940, and has the anchor portions 107*y* fitted into the grooves 105*x*, is formed.

Figure 10C:
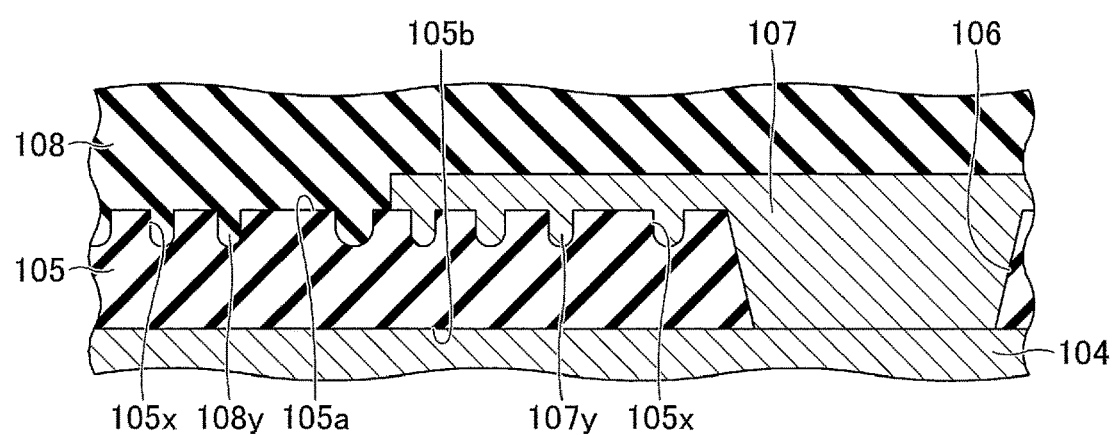

As illustrated in FIG. 10C, the second insulating layer 108 is formed on the first insulating layer 105. The second insulating layer 108 has the anchor portions 108*y* fitted into the grooves 105*x* that are exposed outside the second interconnect layer 107.

As has been described above, the second interconnect layer 107 and the second insulating layer 108 are properly formed by use of the above-described procedure.

Figure 7A:
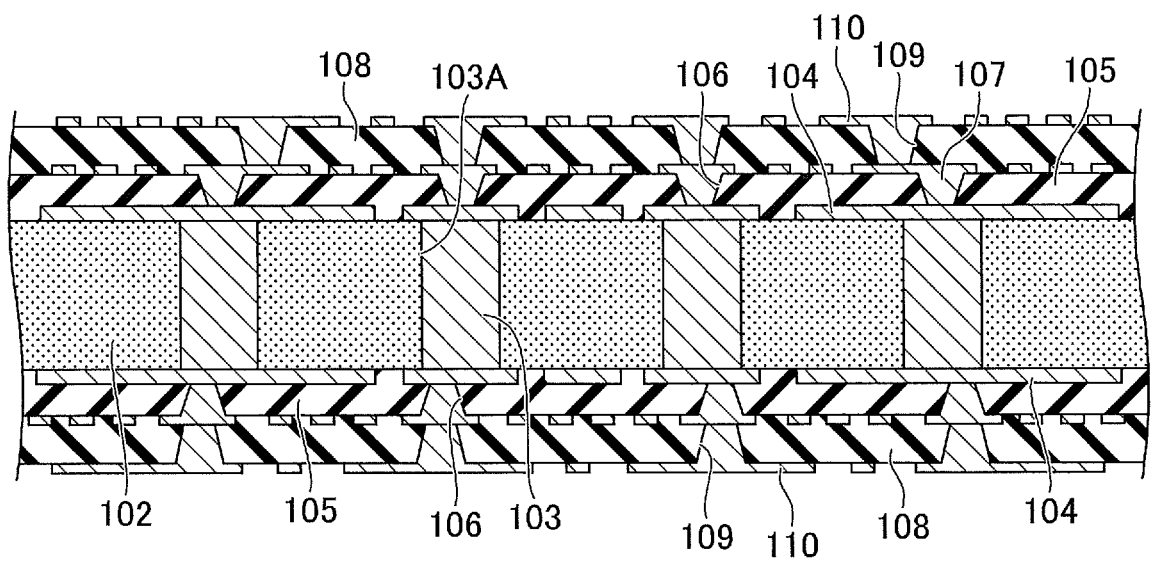
FIGS. 7A and 7B are cross-sectional views illustrating the method of making the interconnect substrate according to the first embodiment.

After forming the second insulating layers 108, as illustrated in FIG. 7A, the second insulating layers 108 over and under the core substrate 102 are processed by a laser beam, which produces, through the second insulating layers 108, the via holes 109 that extend to, and are in contact with, the respective second interconnect layers 107. Further, the third interconnect layers 110 are formed on the respective second insulating layers 108 over and under the core substrate 102, and are connected to the respective second interconnect layers 107 through the via conductors inside the via holes 109. The third interconnect layers 110 may be formed similarly to the manner in which the second interconnect layers 107 are formed. Namely, grooves similar to the grooves 105*x* are formed in the surfaces 108*a* of the second insulating layers 108, and the third interconnect layers 110 are formed that have anchor portions fitted into these grooves.

Figure 7B:
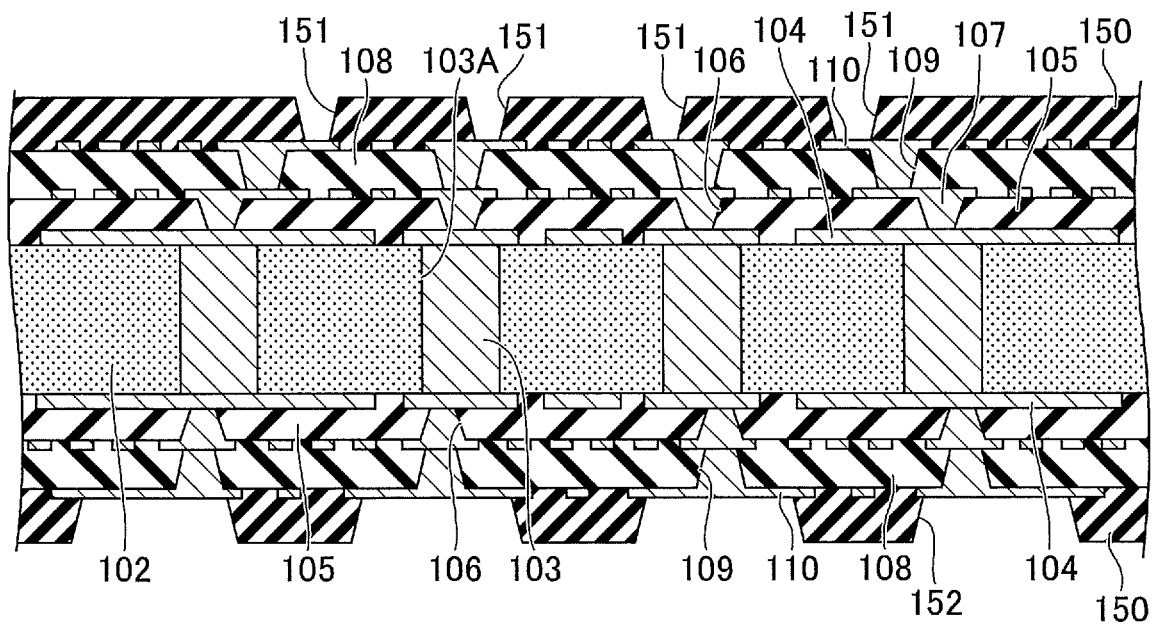

Subsequently, as illustrated in FIG. 7B, the solder resist layers 150 are formed on the respective second insulating layers 108 over and under the core substrate 102. Through the solder resist layer 150 disposed over the core substrate 102 at the position to be connected to a semiconductor chip, openings 151 are formed that extend to, and are in contact with, the upper third interconnect layer 110. Further, the openings 152 that extend to, and are in contact with, the lower third interconnect layer 110 are formed through the solder resist layer 150 disposed under the core substrate 102.

The solder resist layers 150 are made of an insulating resin such as a photosensitive epoxy resin or acrylic resin. The solder resist layers 150 may be formed by attaching resin films or applying a liquid resin. The openings 151 and the openings 152 may be formed by exposure to light and development. An insulating resin such as a non-photosensitive epoxy resin or polyimide resin may be used as the solder resist layers 150. In this case, the openings 151 and the openings 152 may be formed by a laser process or by blasting.

The structure illustrated in FIG. 7B is then cut by a slicer or the like. As a result, structures each corresponding to an interconnect substrate 100 are obtained as separate pieces. Namely, a plurality of interconnect substrates 100 according to the first embodiment are obtained from the large-size core interconnect substrate 101. In this manner, the interconnect substrate 100 of the first embodiment illustrated in FIG. 2 is completed in final form.

The method that has heretofore been described can easily form the grooves 105*x* having a meander shape on the order of nanometers in the surfaces 105*a* of the first insulating layers 105. Further, the second interconnect layers 107, which have the anchor portions 107*y* fitted into the grooves 105*x*, can be easily formed. Similarly, grooves having a meander shape can be easily formed on the order of nanometers in the surfaces 108*a* of the second insulating layers 108. The third interconnect layers 110 can also be easily formed that have anchor portions fitted into these grooves.

It may also be noted that a single sputtering apparatus may be utilized to perform all the processes from the cleaning process after the formation of the via holes 106 (see FIG. 8A) to the process of forming the seed layer 920. Namely, these processes may be continuously performed in a single sputtering apparatus, without unloading the structure inclusive of the core substrate 102.

After forming the solder resist layer 150 and before separation into pieces, connection terminals may be disposed on the upper third interconnect layer 110 to extend through the openings 151 and protrude upwardly from the upper solder resist layer 150 at the position to be connected to the semiconductor chip over the core substrate 102.

First Variation of First Embodiment

Figure 13A:
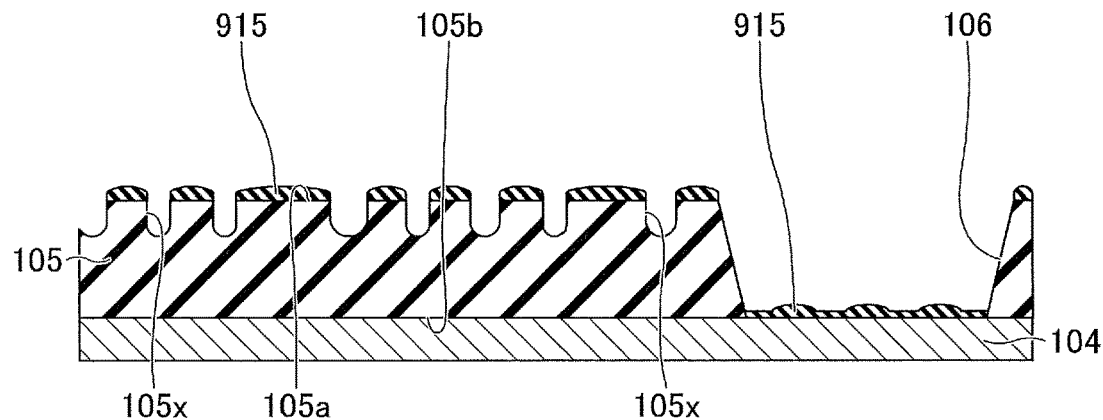
FIGS. 13A through 13C are cross-sectional views illustrating an example of the method of forming an interconnect layer and an insulating layer according to a first variation of the first embodiment.
Figure 13B:
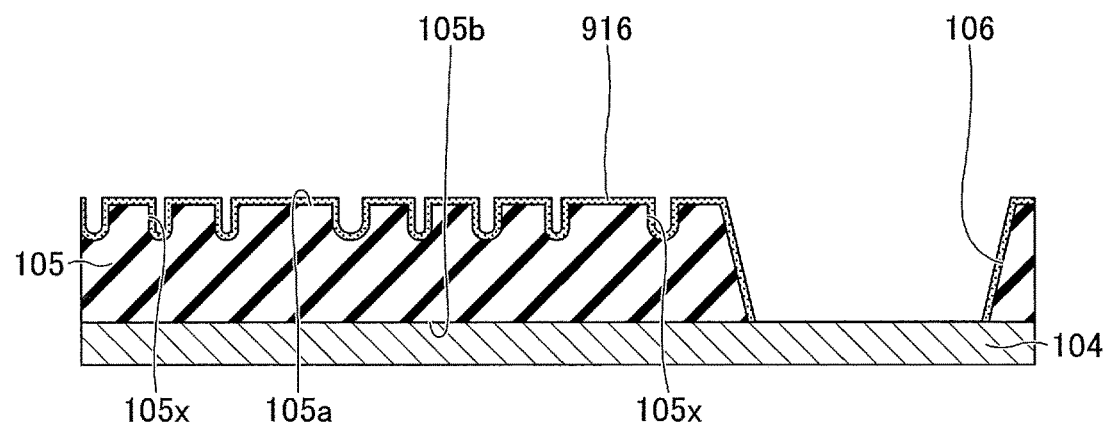
Figure 13C:
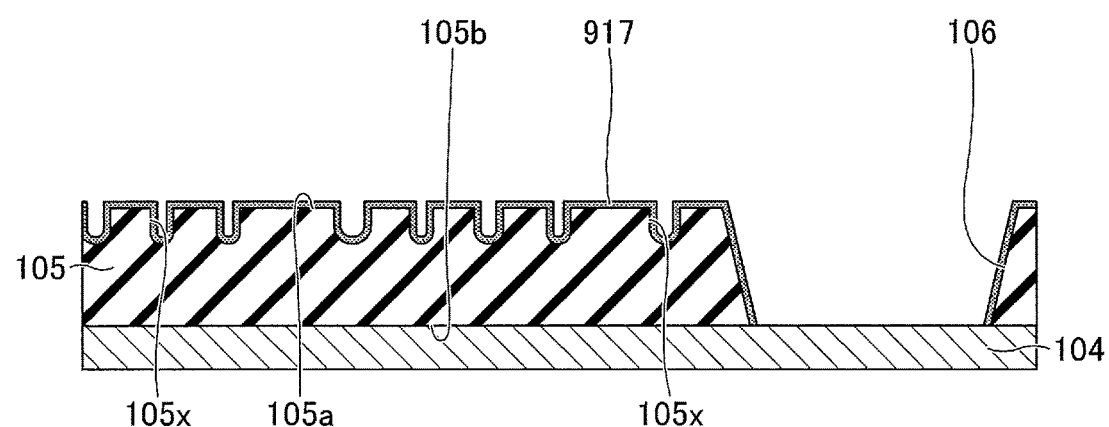

In the following, a first variation of the first embodiment will be described. The first variation differs from the first embodiment mainly in how to form the second interconnect layer 107 and the second insulating layer 108. FIGS. 13A through 13C are cross-sectional views illustrating an example of the method of forming the second interconnect layer 107 and the second insulating layer 108 according to the first variation of the first embodiment. FIGS. 13A through 13C illustrate the same portion as illustrated in FIG. 3.

In the first variation, the processes up to the formation of grooves 105x are performed in the same manner as in the first embodiment (see FIG. 9A). In the first variation, as illustrated in FIG. 13A, the masking film 910 is oxidized during the formation of grooves 105x and turned into an oxide film 915.

After forming the grooves 105x, the oxide film 915 in the first variation is removed as illustrated in FIG. 13B. The oxide film 915 may be removed in the sputtering apparatus used for forming the grooves 105x. In removing the oxide film 915, plasma etching in inverse sputtering may be performed in the sputtering apparatus, for example. In this manner, the structure illustrated in FIG. 13A may be left to stay in the sputtering apparatus after forming the grooves 105x, followed by removing the oxide film 915. Argon gas, for example, may be used as a process gas in the removal of the oxide film 915. During the removal of the oxide film 915, a damaged layer 916 may be created at and near the surface 105a.

Subsequently, as illustrated in FIG. 13C, the damaged layer 916 created at and near the surface 105a during the removal of the oxide film 915 is removed. The damaged layer 916 may be removed in the sputtering apparatus used for removing the oxide film 915. In removing the damaged layer 916, plasma etching in inverse sputtering may be performed at low power in the sputtering apparatus, for example. In this manner, the structure illustrated in FIG. 13B may be left to stay in the sputtering apparatus after removing the oxide film 915, followed by removing the damaged layer 916. Nitrogen gas, for example, may be used as a process gas in the removal of the damaged layer 916. Plasma etching using nitrogen gas as a process gas removes the damaged layer 916, and also forms a modified layer 917 having a functional group, such as a hydroxyl group, a carboxyl group, or the like, at and near the surface 105a. The process gas may further contain oxygen gas.

Thereafter, the process of forming the seed layer 920 and the subsequent processes will be performed in the same manner as in the first embodiment.

The first variation brings about the same or similar advantages as those of the first embodiment. Further, the modified layer 917 having a functional group improves the adhesion between the seed layer 920 and the first insulating layer 105, thereby providing more satisfactory adhesion.

The interconnect substrate 100 made by the method of the first variation does not include the masking film 910.

Even in the case in which no oxidization occurs in the masking film 910, the masking film 910 may be removed after forming the grooves 105x and before forming the seed layer 920, as in the first variation. It is preferable, in this case also, to remove the damaged layer 916 to form a modified layer 917.

In the case in which the masking film 910 is oxidized and turned into the oxide film 915, hydrogen gas may be used to reduce the oxide film 915, rather than removing the oxide film 915.

It may be noted that the oxide film 915 and the masking film 910 may be removed by wet etching. In the case in which the oxide film 915 and the masking film 910 are removed by wet etching, the damaged layer 916 is not likely to be created, which may allow the choice to be made to directly form the seed layer 920. In the case in which copper or zinc is used as the material of the masking film 910, the oxide film 915 and the masking film 910 are easily removed by wet etching. After removing the oxide film 915 and the masking film 910 by wet etching, the seed layer 920 may be formed by a wet process such as electroless plating.

Second Variation of First Embodiment

In the following, a second variation of the first embodiment will be described. The second variation differs from the first embodiment and the like mainly in the configurations of the first insulating layer 105 and the second insulating layer 108.

[Structure of Interconnect Substrate]

Figure 14:
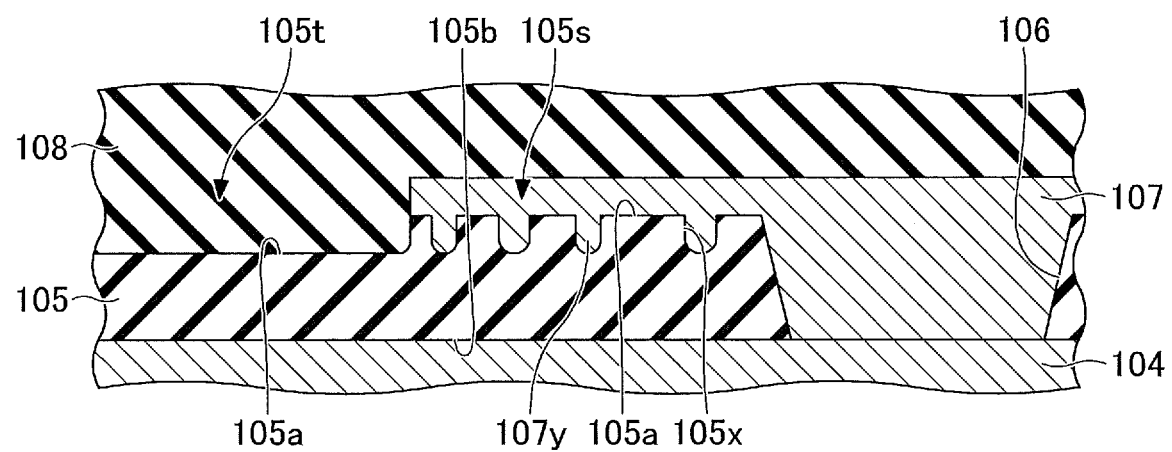
FIG. 14 is a cross-sectional view illustrating an example of the structure of the interconnect substrate according to a second variation of the first embodiment.

In the following, the structure of an interconnect substrate will be described. FIG. 14 is a cross-sectional view illustrating an example of the structure of the interconnect substrate according to a second variation of the first embodiment; FIG. 14 illustrates a portion corresponding to FIG. 3.

As was previously described, the grooves 105x in the first embodiment are formed in both the covered area 105s and the exposed area 105t. In the first embodiment, further, the second insulating layer 108 has the anchor portions 108y fitted into the grooves 105x.

In the second variation, as illustrated in FIG. 14, the grooves 105x are formed in the covered area 105s, but are not formed in the exposed area 105t. The surface 105a in the exposed area 105t is substantially flat. The second insulating layer 108 is in direct contact with the substantially flat surface 105a of the exposed area 105t. The exposed area 105t is situated closer to the core substrate 102 than the covered area 105s is.

The remaining configurations are the same as or similar to the configurations of the first embodiment.

According to the second variation, as in the first embodiment, adhesion between the first insulating layer 105 and the second interconnect layer 107 is improved while ensuring satisfactory transmission characteristics with respect to radio frequency signals. In the first embodiment, there may be a risk that the first insulating layer 105 may have a resin thereof modified in some regions around the grooves 105x in the exposed area 105t, or a residual of a metal compound contained in the masking film 910 or the seed layer 920 may be present around the grooves 105x in the exposed area 105t. In the second variation, on the other hand, such a risk is reduced. According to the second variation, thus, the first insulating layer 105 has a more reliable insulating property.

As for the second insulating layer 108, the exposed area of the surface 108a exposed outside the third interconnect layer 110 may also have a substantially flat surface, similarly to the exposed area 105t. With this arrangement, the second insulating layer 108 has a more reliable insulating property.

[Method of Making Interconnect Substrate]

Figure 15A:
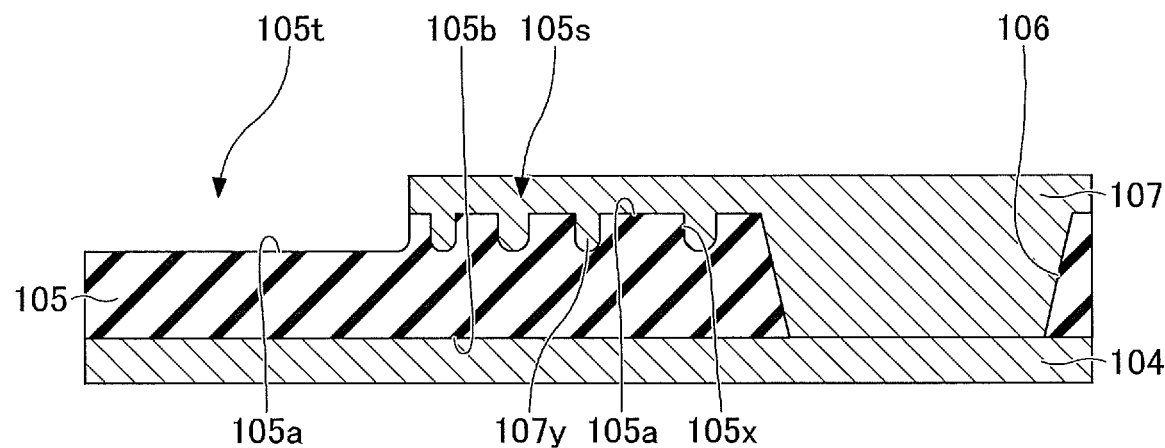
FIGS. 15A and 15B are cross-sectional views illustrating an example of the method of making the interconnect substrate according to the second variation of the first embodiment.
Figure 15B:
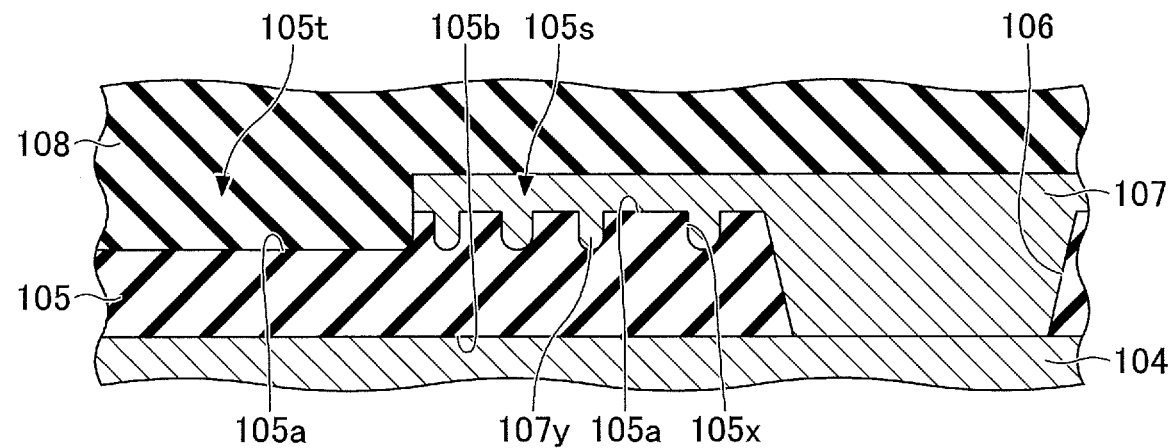

In the following, a method of making the interconnect substrate will be described. FIGS. 15A and 15B are cross-sectional views illustrating an example of the method of making the interconnect substrate according to the second variation of the first embodiment.

In the second variation, the processes up to the removal of the seed layer 920 and the masking film 910 are performed in the same manner as in the first embodiment (see FIG. 10B). Subsequently, as illustrated in FIG. 15A, the second interconnect layer 107 is used as a mask to remove a surface layer of the first insulating layer 105 around the grooves 105x in the exposed area 105t. In removing the surface layer of the first insulating layer 105, plasma etching may be performed in the plasma etching apparatus, for example. Oxygen gas or carbon tetrafluoride gas, for example, may be used as a process gas in the removal of the first insulating layer 105. A mixed gas of oxygen gas and carbon tetrafluoride gas may alternatively be used as the process gas. As a result of removing the surface layer of the first insulating layer 105, the surface 105a becomes substantially flat in the exposed area 105*t*. The first insulating layer 105 may initially have a resin thereof modified in some regions around the grooves 105*x* in the exposed area 105*t*, or a residual of a metal compound contained in the masking film 910 or the seed layer 920 may initially be present around the grooves 105*x* in the exposed area 105*t*. With the above-noted arrangement, however, these modified resin and residual metal compound are removed.

Subsequently, as illustrated in FIG. 15B, the second insulating layer 108 is formed on the first insulating layer 105. The second insulating layer 108 is in direct contact with the substantially flat surface 105*a* of the exposed area 105*t*.

Thereafter, the process of forming via holes 109 and the subsequent processes will be performed in the same manner as in the first embodiment.

The first insulating layer 105 may initially have a resin thereof modified in some regions around the grooves 105*x* in the exposed area 105*t*, or a residual of a metal compound contained in the masking film 910 or the seed layer 920 may initially be present around the grooves 105*x* in the exposed area 105*t*. According to the second variation, these modified resin and residual metal compound are removed, thereby providing a more reliable insulating property.

In the second variation also, the masking film 910 or the oxide film 915 may be removed after forming the grooves 105*x* and before forming the seed layer 920. It is preferable, in this case also, to remove the damaged layer 916 to form a modified layer 917. In the case in which the oxide film 915 is formed, hydrogen gas may be used to reduce the oxide film 915.

As for the second insulating layer 108, the exposed area of the surface 108*a* exposed outside the third interconnect layer 110 may also be made into a substantially flat surface, similarly to the exposed area 105*t*.

Third Variation of First Embodiment

In the following, a third variation of the first embodiment will be described. The third variation differs from the first embodiment and the like mainly in the configurations of the first insulating layer 105 and the second insulating layer 108.
[Structure of Interconnect Substrate]

Figure 16:
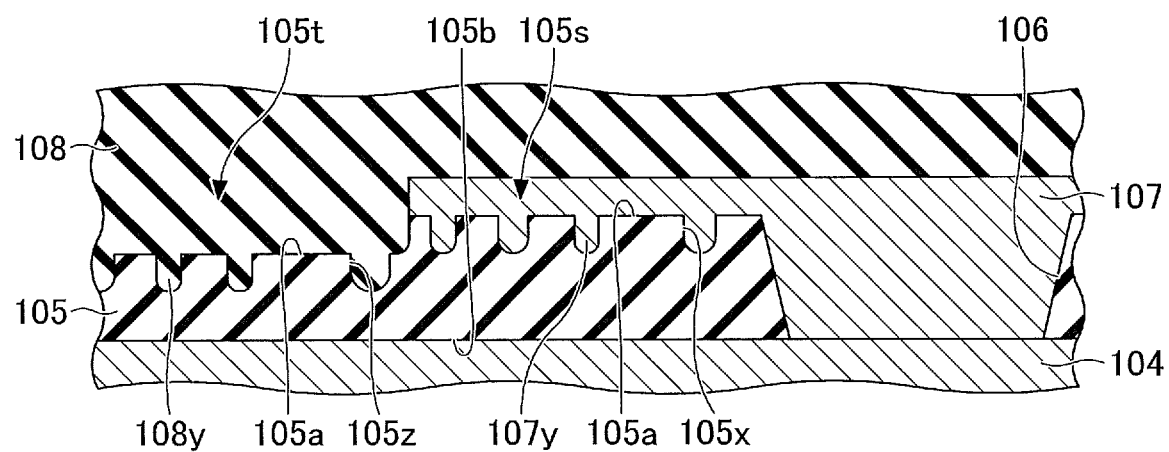
FIG. 16 is a cross-sectional view illustrating an example of the structure of the interconnect substrate according to a third variation of the first embodiment.

In the following, the structure of an interconnect substrate will be described. FIG. 16 is a cross-sectional view illustrating an example of the structure of the interconnect substrate according to the third variation of the first embodiment; FIG. 16 illustrates a portion corresponding to FIG. 3.

As illustrated in FIG. 16, the exposed area 105*t* in the third variation is situated closer to the core substrate 102 than the covered area 105*s* is, similarly to the second variation. In the third variation, unlike the second variation, grooves 105*z* substantially the same in shape as the grooves 105*x* are formed in the exposed area 105*t*. The second insulating layer 108 has anchor portions 108*y* fitted into the grooves 105*z* in the exposed area 105*t*.

The remaining configurations are the same as or similar to the configurations of the second variation of the first embodiment.

The third variation brings about the same or similar advantages as those of the first embodiment. Further, as in the second variation, the first insulating layer 105 has a more reliable insulating property.

As for the second insulating layer 108, the exposed area of the surface 108*a* exposed outside the third interconnect layer 110 may also have grooves substantially the same in form as the grooves 105*z*.

[Method of Making Interconnect Substrate]

Figure 17A:
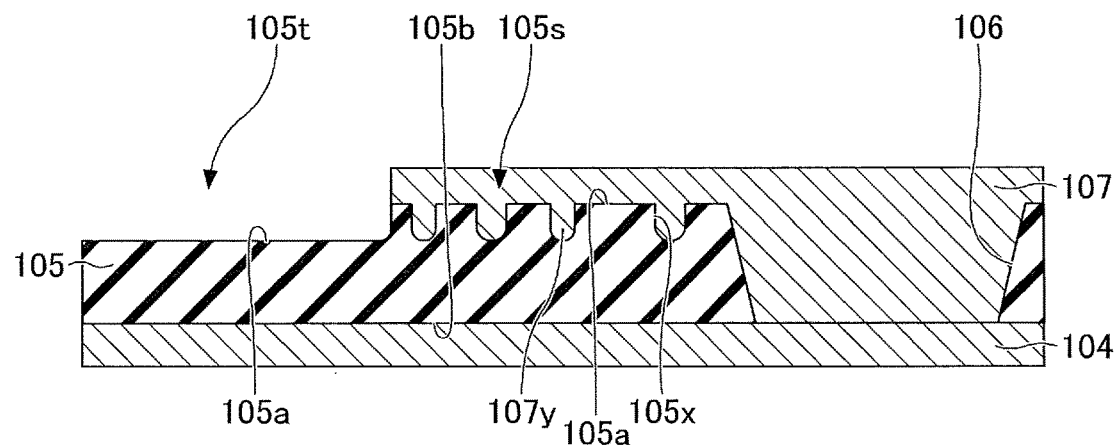
FIGS. 17A through 17C are cross-sectional views illustrating an example of the method of making the interconnect substrate according to the third variation of the first embodiment.
Figure 17B:
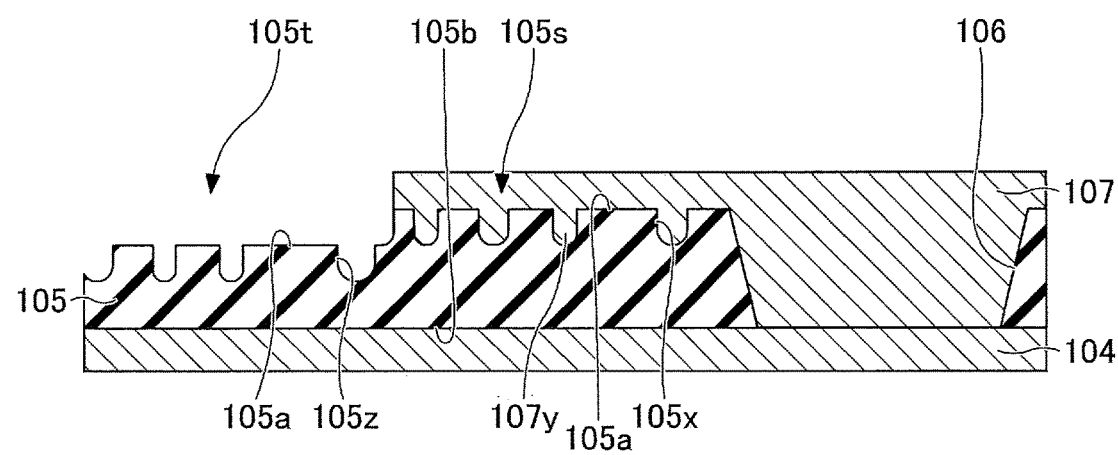
Figure 17C:
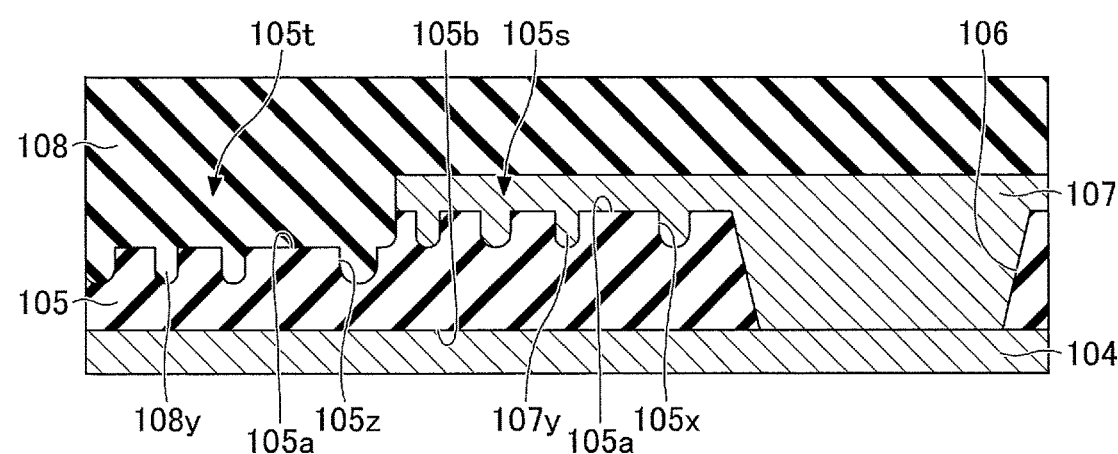

In the following, a method of making the interconnect substrate will be described. FIGS. 17A through 17C are cross-sectional views illustrating an example of the method of making the interconnect substrate according to the third variation of the first embodiment.

In the third variation, the processes up to the removal of the seed layer 920 and the masking film 910 are performed in the same manner as in the first embodiment (see FIG. 10B). Subsequently, as illustrated in FIG. 17A, the second interconnect layer 107 is used as a mask to remove a surface layer of the first insulating layer 105 around the grooves 105*x* in the exposed area 105*t*, similarly to the second variation. As a result, the surface 105*a* in the exposed area 105*t* becomes substantially flat.

Then, as illustrated in FIG. 17B, the grooves 105*z* substantially the same in form as the grooves 105*x* are formed in the surface 105*a* of the exposed area 105*t*. In forming the grooves 105*z*, the processes from the formation of the masking film 910 to the formation of the modified layer 917 are performed in substantially the same manner as in the first variation (see FIGS. 8B, 8C, 9A, and 13A through 13C). In the case of the masking film 910 being not oxidized, the masking film 910 may be removed in place of the oxide film 915. The grooves 105*z* are an example of third grooves.

As illustrated in FIG. 17C, the second insulating layer 108 is formed on the first insulating layer 105. The second insulating layer 108 has the anchor portions 108*y* fitted into the grooves 105*z* that are exposed outside the second interconnect layer 107.

Thereafter, the process of forming via holes 109 and the subsequent processes will be performed in the same manner as in the first embodiment.

In the third variation also, the masking film 910 or the oxide film 915 may be removed after forming the grooves 105*x* and before forming the seed layer 920. It is preferable, in this case also, to remove the damaged layer 916 to form a modified layer 917. In the case in which the oxide film 915 is formed, hydrogen gas may be used to reduce the oxide film 915.

As for the second insulating layer 108, the exposed area of the surface 108*a* exposed outside the third interconnect layer 110 may also have grooves substantially the same in form as the grooves 105*z*.

Second Embodiment

The second embodiment is directed to an interconnect substrate including no core substrate, which may often be referred to as a coreless substrate.
[Structure of Interconnect Substrate]

Figure 18:
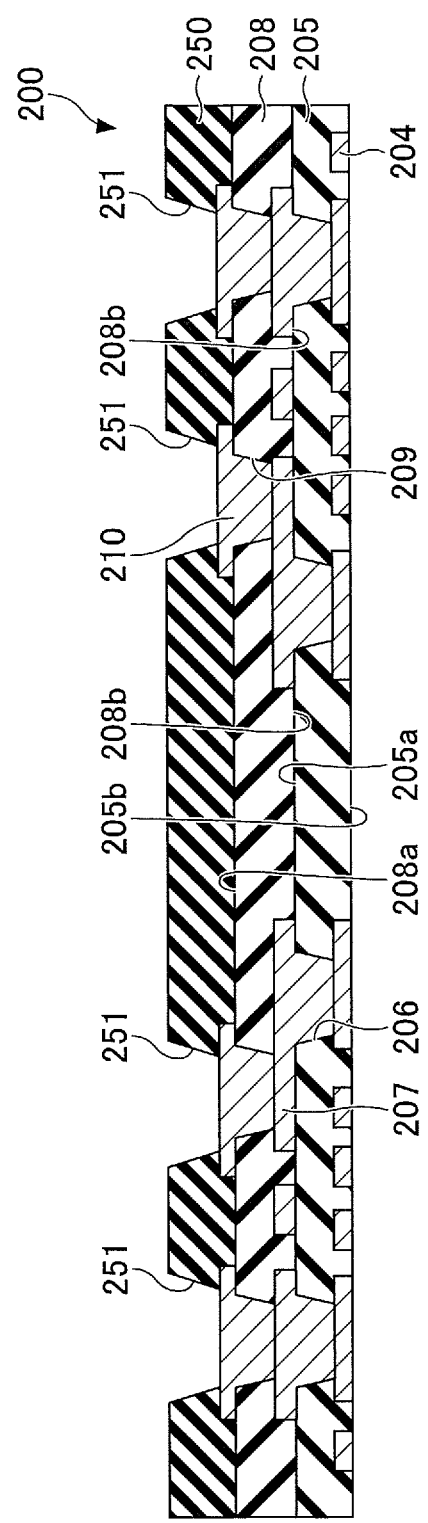
FIG. 18 is a cross-sectional view illustrating an example of the structure of an interconnect substrate according to a second embodiment.

In the following, the structure of an interconnect substrate will be described. FIG. 18 is a cross-sectional view illustrating an example of the structure of an interconnect substrate according to a second embodiment.

As illustrated in FIG. 18, an interconnect substrate 200 of the second embodiment includes a first interconnect layer 204, a first insulating layer 205, a second interconnect layer 207, and a second insulating layer 208. The first insulating layer 205 has a surface 205*a* situated on the side where a semiconductor chip is to be connected, and has a surface 205*b* on the opposite side from the surface 205*a*. The first interconnect layer 204 is formed in the surface 205*b*. The first insulating layer 205 has via holes 206 in contact with the first interconnect layer 204. The second interconnect layer 207 is disposed on the first insulating layer 205 to be coupled to the first interconnect layer 204 through via conductors inside the via holes 206. Further, the second insulating layer 208 is disposed on the first insulating layer 205. The second insulating layer 208 has a surface 208a situated on the side where a semiconductor chip is to be connected, and has a surface 208b on the opposite side from the surface 208a. The second insulating layer 208 has via holes 209 in contact with the second interconnect layer 207. A third interconnect layer 210 is disposed on the second insulating layer 208 to be coupled to the second interconnect layer 207 through via conductors inside the via holes 209.

A solder resist layer 250 is disposed on the second insulating layer 208. The solder resist layer 250 has via holes 251 that extend to, and are in contact with, the third interconnect layer 210.

The first interconnect layer 204, the second interconnect layer 207, and the third interconnect layer 210 are conductive layers inclusive of a copper layer or the like, for example. The first insulating layer 205 and the second insulating layer 208 are resin layers containing an insulating resin such as an epoxy resin or a polyimide resin, for example. The first insulating layer 205 and the second insulating layer 208 may contain a filler such as silica.

The surface 205a of the first insulating layer 205 and the surface 208a of the second insulating layer 208 have grooves formed therein similar to the grooves 105x illustrated in FIG. 3 and FIG. 4. The second interconnect layer 207 has anchor portions fitted into the grooves formed in the surface 205a. The second insulating layer 208 also has anchor portions fitted into the grooves formed in the surface 205a. The third interconnect layer 210 has anchor portions fitted into the grooves formed in the surface 208a. The solder resist layer 250 also has anchor portions fitted into the grooves formed in the surface 208a.

According to the second embodiment described above, adhesion between the first insulating layer 205 and the second interconnect layer 207 as well as adhesion between the second insulating layer 208 and the third interconnect layer 210 are improved. Further, adhesion between the first insulating layer 205 and the second insulating layer 208 is also improved.

Because the grooves are on the order of nanometers, an increase in the length of signal transmission paths is reduced, which ensures that satisfactory transmission characteristics are provided with respect to radio-frequency signals.

It may be noted that connection terminals may be disposed on the third interconnect layer 210 to extend through the via holes 251 and protrude upwardly from the solder resist layer 250.

[Method of Making Interconnect Substrate]

In the following, a method of making the interconnect substrate will be described. FIGS. 19A and 19B through FIG. 22 are cross-sectional views illustrating an example of a method of making the interconnect substrate according to the second embodiment.

Figure 19A:
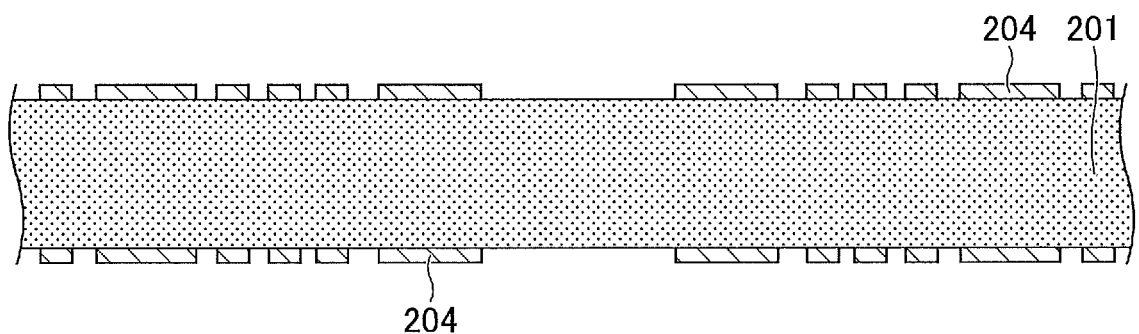
FIGS. 19A and 19B are cross-sectional views illustrating the method of making the interconnect substrate according to the second embodiment.

As illustrated in FIG. 19A, a support base 201 is provided. The support base 201 includes a support substrate, and further includes an adhesive layer and a metal layer on each side of the support substrate, for example. The support base may be a woven cloth or unwoven cloth (not shown) of glass fiber, aramid fiber, or the like impregnated with an insulating resin such as an epoxy-based resin, for example. As the adhesive layer, a metal foil such as a copper foil, an aluminum foil, a nickel foil, or a zinc foil, a ceramic plate, or a resin sheet made mainly of a resin such as acrylic or polyimide may be used. A copper foil or the like, for example, may be used as the metal layer.

As is still illustrated in FIG. 19A, first interconnect layers 204 are formed on the respective sides of the support base 201. The first interconnect layers 204 may be formed by a semi-additive process, for example.

Figure 19B:
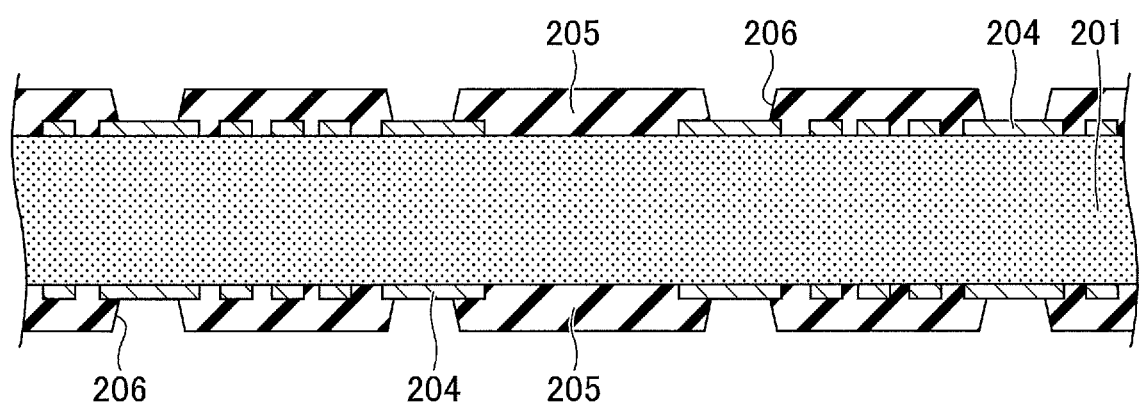

As illustrated in FIG. 19B, uncured resin films, which are attached to the respective surfaces of the support base 201, are heated and cured to turn into first insulating layers 205. The first insulating layers 205 are made of an insulating resin such as an epoxy resin or a polyimide resin. Alternatively, a liquid resin may be applied to form the first insulating layers 205. Subsequently, the first insulating layers 205 on the respective surfaces of the support base 201 are processed by a laser, which produces, through the first insulating layers 205, via holes 206 that extend to, and are in contact with, the respective first interconnect layers 204.

Figure 20A:
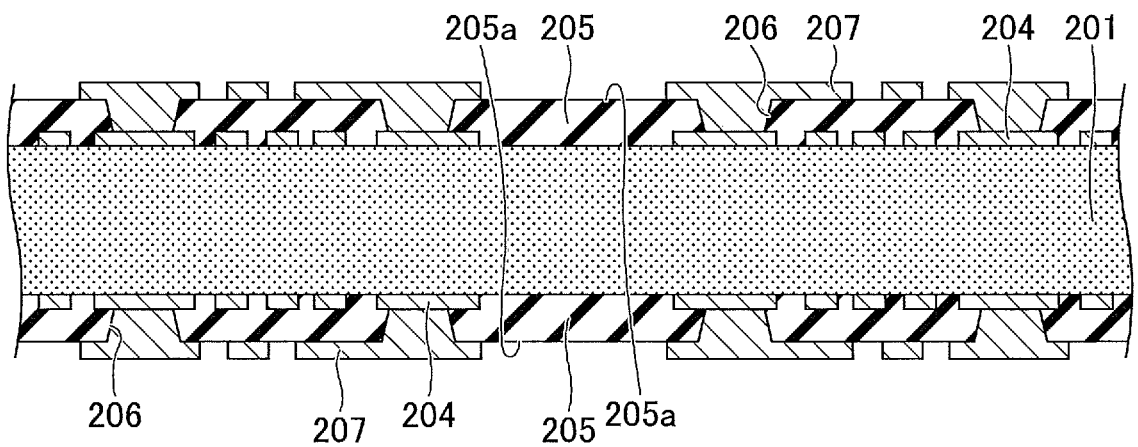
FIGS. 20A and 20B are cross-sectional views illustrating the method of making the interconnect substrate according to the second embodiment.

As illustrated in FIG. 20A, second interconnect layers 207 are formed on the respective first insulating layers 205 over and under the support base 201, and are connected to the respective first interconnect layers 204 through the via conductors inside the via holes 206.

Figure 20B:
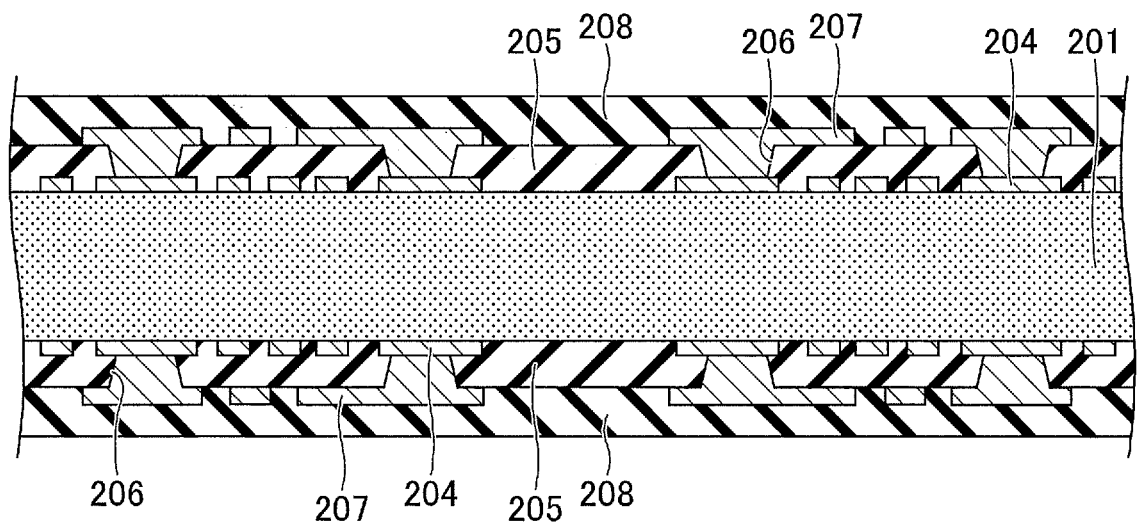

As illustrated in FIG. 20B, second insulating layers 208 are formed on the respective first insulating layers 205 over and under the support base 201.

The second interconnect layers 207 and the second insulating layers 208 may be formed by substantially the same method as the method of forming the second interconnect layer 107 and the second insulating layer 108 according to the first embodiment as illustrated in FIGS. 8A to 8C through FIGS. 10A to 10C. Namely, grooves similar in shape to the grooves 105x are formed in the surfaces 205a of the first insulating layers 205, and the second interconnect layers 207 and the second insulating layers 208 are formed that have anchor portions fitted into these grooves.

Figure 21A:
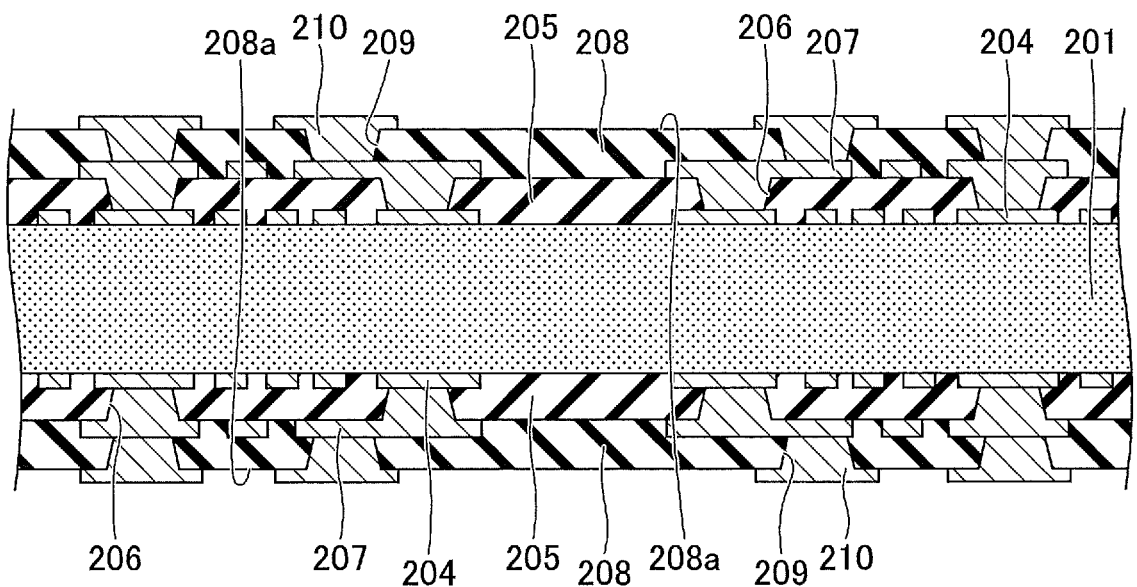
FIGS. 21A and 21B are cross-sectional views illustrating the method of making the interconnect substrate according to the second embodiment.

Subsequently, as illustrated in FIG. 21A, the second insulating layers 208 over and under the support base 201 are processed by a laser beam, which produces, through the second insulating layers 208, via holes 209 that extend to, and are in contact with, the respective second interconnect layers 207. Further, third interconnect layers 210 are formed on the respective second insulating layers 208 over and under the support base 201, and are connected to the respective second interconnect layers 207 through the via conductors inside the via holes 209. The third interconnect layers 210 may be formed similarly to the manner in which the second interconnect layers 207 are formed. Namely, grooves similar in shape to the grooves 105x are formed in the surfaces 208a of the second insulating layers 208, and the third interconnect layers 210 are formed that have anchor portions fitted into these grooves.

Figure 21B:
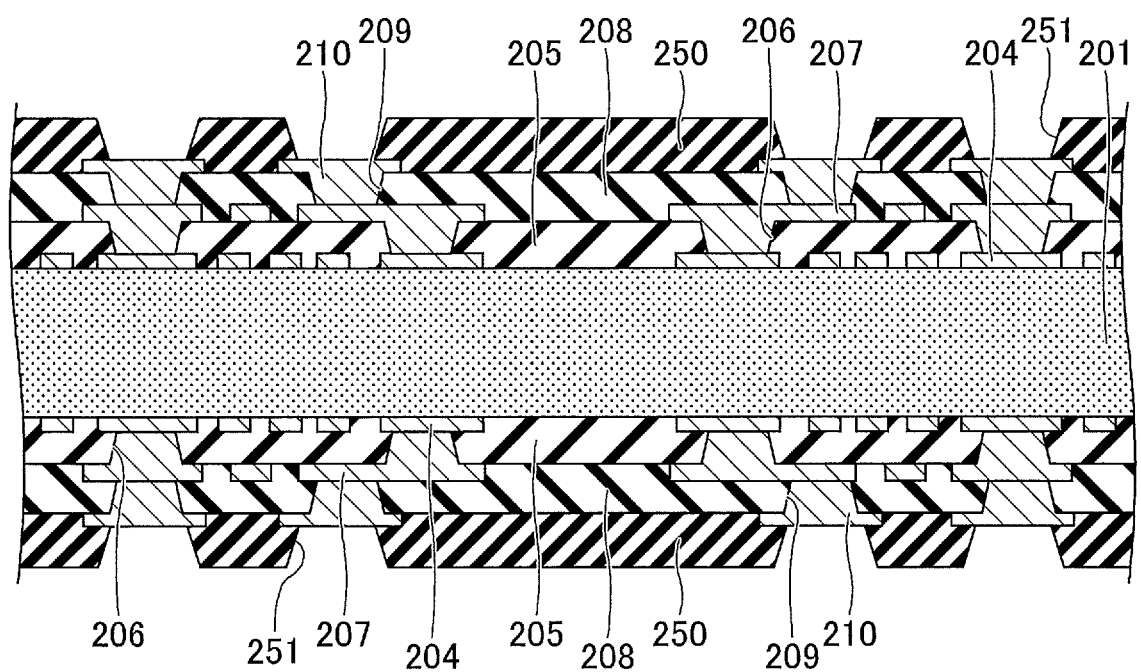

Subsequently, as illustrated in FIG. 21B, solder resist layers 250 are formed on the respective second insulating layers 208 over and under the support base 201. Via holes 251 are then formed through the solder resist layers 250 over and under the support base 201 such as to extend to, and be in contact with, the respective third interconnect layers 210. The solder resist layers 250 and the via holes 251 may be formed similarly to the manner in which the solder resist layers 150 and the openings 151 are formed in the first embodiment.

The structure illustrated in FIG. 21B is then cut by a slicer or the like. As a result, the structure inclusive of the support base 201 and corresponding to the interconnect substrate 200 is separated into pieces. The structure illustrated in FIG. 21B may alternatively be attached to a carrier, and, then, may be cut by a slicer or the like.

Figure 22:
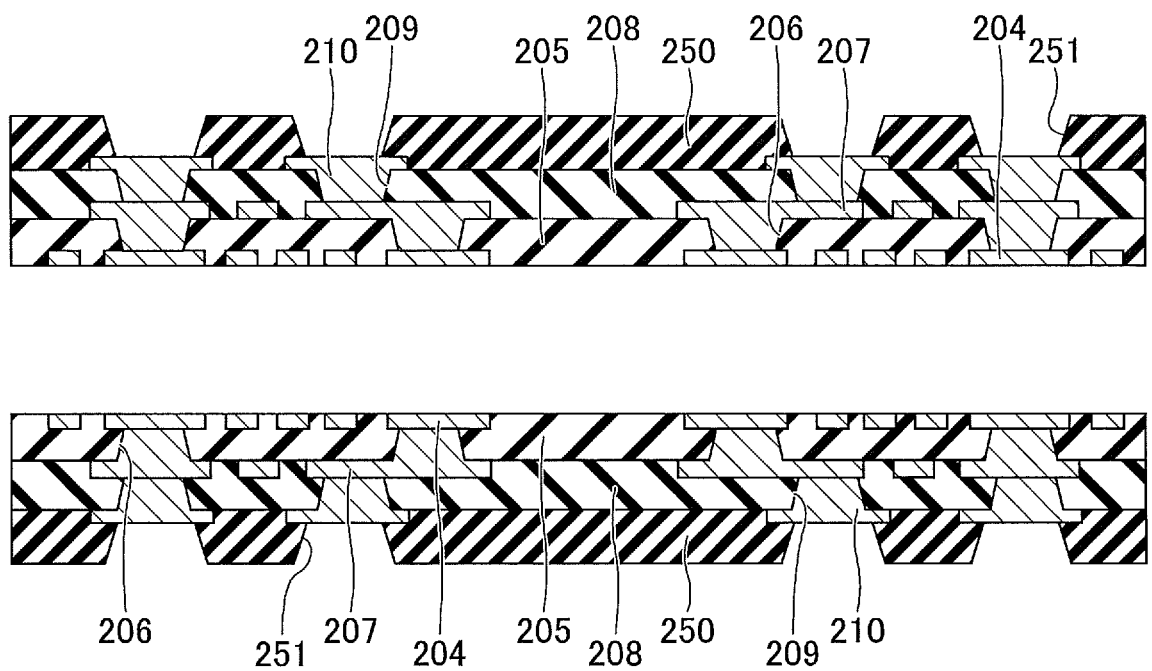
FIG. 22 is a cross-sectional view illustrating the method of making the interconnect substrate according to the second embodiment.

Subsequently, as illustrated in FIG. 22, the structures corresponding to the interconnect substrate 200 are separated from both sides of the support base 201. In this manner, the interconnect substrate 200 of the second embodiment illustrated in FIG. 18 is completed in final form.

The method that has heretofore been described can easily form the grooves having a meander shape on the order of nanometers in the surfaces 205a of the first insulating layers 205 and in the surfaces 208a of the second insulating layers 208. Further, the second interconnect layers 207 and the third interconnect layers 210 that have anchor portions fitted into these grooves can be easily formed.

It may be noted that the first through third variations of the first embodiment may be applied to the second embodiment.

In the case in which a thermoplastic resin is used as the material of the insulating layer 105 in the present disclosures, it is preferable to use microwave plasma etching to form the grooves 105x and 105z in the insulating layer 105. Microwave plasma etching is performable at low temperature, which reduces damage to the insulating layer 105. In contrast, using reactive ion etching (RIE) to perform etching on the thermoplastic resin constituting the insulating layer 105 may create a risk that the insulating layer 105 is modified or deformed due to the effect of plasma, heat, and the like. Such modification or deformation of the insulating layer 105 may cause the shape of the grooves 105x or 105z to collapse, or may cause the surface of the insulating layer 105 to have fibrils, thereby resulting in a failure to provide sufficient adhesion strength in some cases.

Dry processes may be performed for the processes from the formation of the masking film 910 to the formation of the grooves 105x, and wet processes may be performed for the processes from the removal of the masking film 910 or the oxide film 915 to the formation of the seed layer 20. Use of an amphoteric substance having a low melting point as the material of the masking film 910 allows the masking film 910 or the oxide film 915 to be readily removed at a pretreatment such as pickling, and allows the pitch of the recesses 911 and the bulges 912 to be increased. An increase in the pitch of the recesses 911 and the bulges 912 makes it easier for the seed layer 20 to fit into the grooves 105x even in a wet process (i.e., electroless plating). A conventional apparatus may be used for wet processes.

<Preferred Configuration of Grooves>

In the following, a preferred configuration of the grooves having a meander shape in a plan view and formed in an insulating layer will be described.

[Pitch of Grooves]

Figure 23:
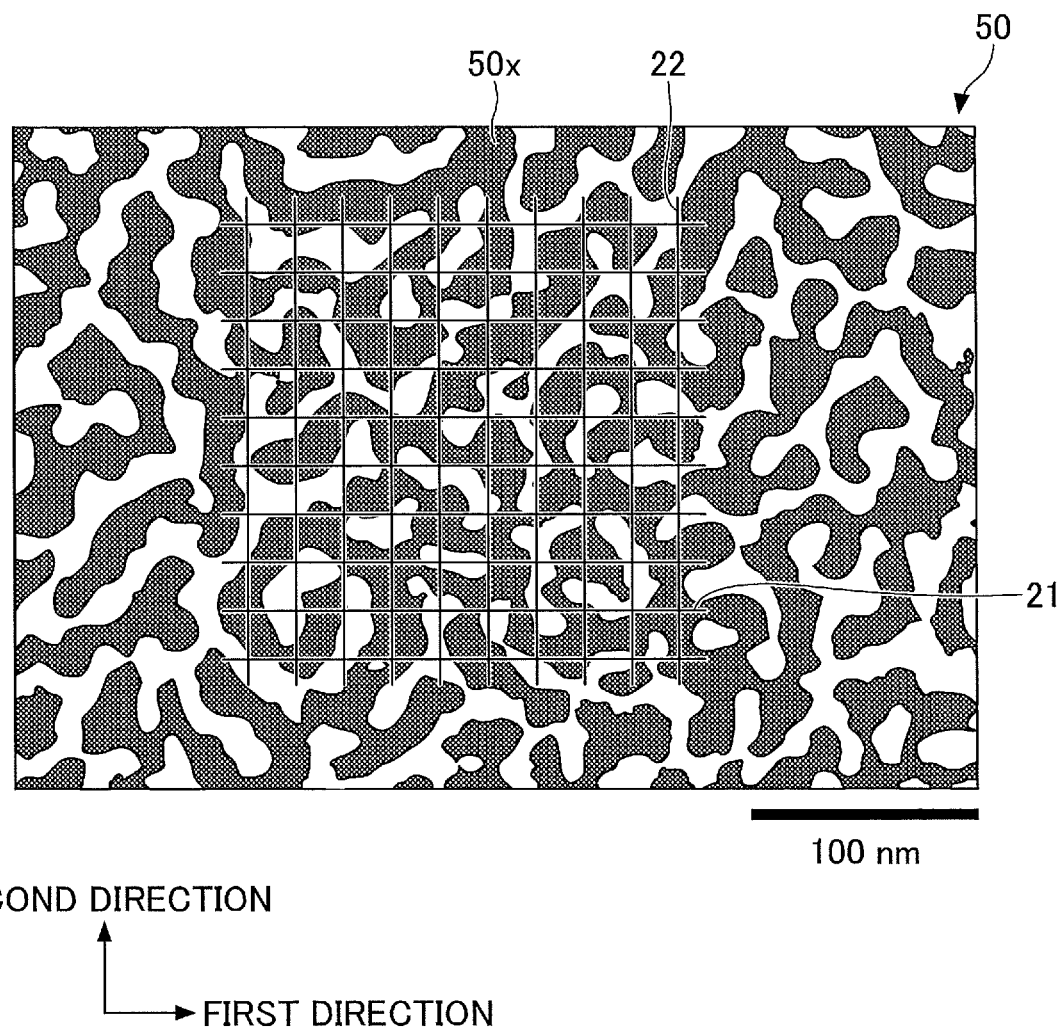
FIG. 23 is a drawing illustrating an example of a method of determining a pitch.

The pitch of grooves is preferably greater than or equal to 10 nm and less than or equal to 100 nm. Use of the pitch of grooves less than 10 nm causes the grooves and the insulating resin ridges to be excessively thin, which creates a risk that the strength the anchor portions is lowered. Use of the pitch of grooves exceeding 100 nm may create a risk that adhesion is lowered due to an insufficient number of anchors in the case in which interconnects become finer. Further, it is difficult to make a masking film having grooves whose pitch is less than 10 nm or greater than 100 nm by use of the production methods described heretofore. Forming insulating layer grooves whose pitch is less than 10 nm or greater than 100 nm is thus difficult. The pitch of grooves is more preferably greater than or equal to 20 nm and less than or equal to 60 nm. The pitch d of grooves may be determined by the following method. FIG. 23 is a drawing illustrating an example of a method of determining a pitch;

FIG. 23 illustrates an insulating layer 50 in which grooves 50x are formed. Within the plane in which the grooves 50x are arranged, ten or more line segments 21 extending in a first direction and arrayed at constant intervals in a second direction perpendicular to the first direction are placed, followed by counting the number of intersecting grooves 50x for each line segment 21. Further, ten or more line segments 22 extending in the second direction and arrayed at constant intervals in the first direction are placed, followed by counting the number of intersecting grooves 50x for each line segment 22. The average of the numbers of intersecting grooves 50x is calculated over the ten or more line segments 21 and the ten or more line segments 22. The length of the line segments 21 and the line segments 22 is a constant length L. The length L of the line segments 21 and 22 is divided by the calculated average, and the obtained value is considered to be the pitch of the grooves 50x.

If the length L of the line segments 21 and 22 is inappropriately short, the calculated pitch of the grooves 50x may not reliably reflect the distribution of the grooves 50x. The length L of the line segments 21 and 22 is thus set greater than or equal to 200 nm. The length L of the line segments 21 and 22 may be greater than or equal to 200 nm and less than or equal to 1 µm. The length L of the line segments 21 and 22 may be set to 250 nm, for example.

If the interval between the adjacent line segments 21 or the interval between the adjacent line segments 22 is inappropriately short, the calculated pitch of the grooves 50x may not reliably reflect the distribution of the grooves 50x. In consideration of this, the interval between the line segments 21 or 22 is set greater than or equal to 20 nm. The interval between the line segments 21 or 22 may be greater than or equal to 20 nm and less than or equal to 100 nm.

[Average Width of Grooves]

The average width of grooves is preferably greater than or equal to 3 nm and less than or equal to 50 nm. Use of the average width of grooves less than 3 nm makes it difficult for a seed layer to fill the grooves, which causes difficulty for anchor portions of an interconnect layer to be properly formed, or causes the anchor portions of an interconnect layer to become thinner. As a result, the anchor portions of an interconnect layer may not have sufficient strength. Use of the average width of grooves exceeding 50 nm causes the aspect ratio of grooves (i.e., the ratio of the depth to width of grooves) to become smaller, which may cause the anchoring effect to be lowered. The average width of grooves is more preferably greater than or equal to 10 nm and less than or equal to 40 nm.

[Relationship between Length of Grooves and Average Width of Grooves]

It is preferable to use a structure having a large number of long, thin grooves of which the length is more than several times the average width. Specifically, when the ratio defined as "groove length"/"groove average width" in a plan view is obtained for the grooves existing in an area greater than 200 nm square, the average ratio is preferably greater than or equal to 4.0. In the case of the average ratio being less than 4.0, the surface structure is such that short grooves are prevalent, which may result in an insufficient strength of the anchor portions of the interconnect layer. It may be noted that the surface of the interconnect layer may have short grooves and pinhole-like recesses.

[Groove Occupancy Ratio]

The ratio of areas occupied by grooves to the total area of a surface having the grooves formed therein in a plane view (i.e., groove occupancy ratio) is preferably greater than or equal to 10 area % and less than or equal to 60 area %. When the groove occupancy ratio is less than 10 area %, there may be a risk that the amount of anchor portions of the interconnect layer is insufficient, failing to provide sufficient adhesion. When the groove occupancy ratio is more than 60 area %, there may be a risk that the amount of bulges of the insulating layer to support the anchor portions of the interconnect layer is insufficient, resulting in an insufficient strength of the insulating layer. The groove occupancy ratio is more preferably greater than or equal to 20 area % and less than or equal to 50 area %. The groove occupancy ratio is preferably comparable to the value (%) obtained by dividing a breaking strength S1 of an insulating layer resin by the sum (S1+S2) of the breaking strength S1 and a breaking strength S2 of an interconnect layer metal.

[Depth of Grooves]

The depth of grooves is preferably greater than or equal to 10 nm and less than or equal to 50 nm. When the depth of grooves is less than 10 nm, there may be a risk that the anchoring effect is insufficient, failing to provide sufficient adhesion. When the depth of grooves exceeds 50 nm, there may be a risk that the surface irregularities of an insulating layer become excessively large, resulting in an increase in transmission loss. Also, it may become difficult for a seed layer to fill the grooves, which prevents the anchor portions of an interconnect layer from being properly formed, resulting in a lowered adhesion. The depth of grooves is more preferably greater than or equal to 20 nm and less than or equal to 40 nm.

<Example Observation>

In the following, observations of samples that were made as described herein will be described. FIGS. 24A through 24D are drawings illustrating examples of images of an insulating layer surface obtained by a scanning electron microscope (SEM). FIGS. 25A through 25D are drawings illustrating images obtained by binarizing the SEM images illustrated in FIGS. 24A through 24D.

The SEM images illustrated in FIGS. 24A through 24D are the surface images of insulating layers of the samples that were made by changing the conditions for forming a masking film and etching conditions. These SEM images were binarized to produce the images illustrated in FIGS. 25A through 25D. With respect to the images illustrated in FIGS. 25A through 25D, medial axes were identified, followed by calculating the average width of recesses, the average of ratios of the length to average width of recesses (i.e., the average of ratios each defined as (length of a recess)/(average width of a recess)), the pitch of recesses, and a recess occupancy ratio. Table 1 illustrates the calculated figures. The average of ratios each defined as (the length of a recess)/(the average width of a recess) is the average of ratios calculated over all the recesses (inclusive of grooves) existing in an observed image when the ratios are each obtained as (the length of a recess)/(the average width of a recess).

TABLE 1

| SAMPLE NO. | 1 | 2 | 3 | 4 |
| --- | --- | --- | --- | --- |
| AVERAGE WIDTH OF RECESSES [nm] | 6.6 | 7.5 | 8.0 | 3.4 |
| AVERAGE OF RATIOS EACH DEFINED AS (LENGTH OF RECESS)/(AVERAGE WIDTH OF RECESS) | 1.6 | 4.6 | 18.1 | 61.0 |
| PITCH OF RECESSES [nm] | 53.2 | 46.3 | 39.7 | 29.8 |
| RECESS OCCUPANCY RATIO [AREA %] | 30.4 | 30.2 | 56.5 | 46.9 |

Figure 25B:
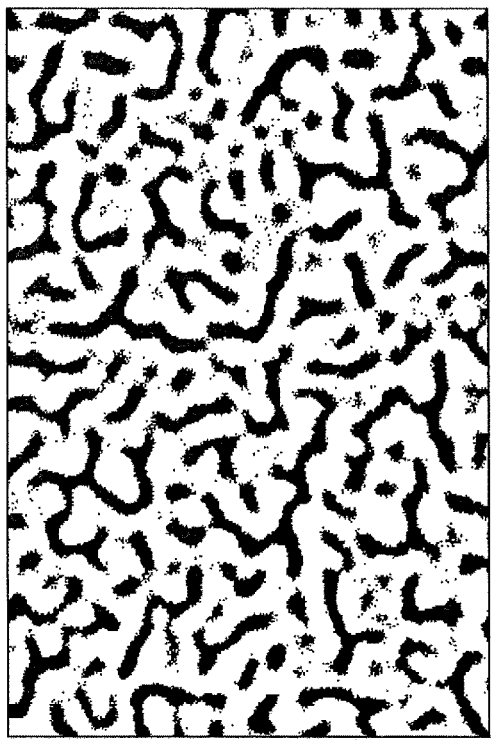
FIGS. 25A through 25D are drawings illustrating images obtained by binarizing the SEM images illustrated in FIGS. 24A through 24D.
Figure 25D:
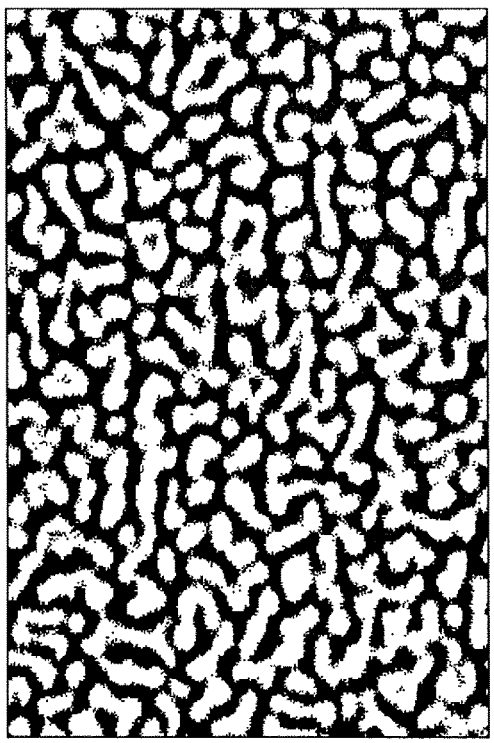
Figure 25A:
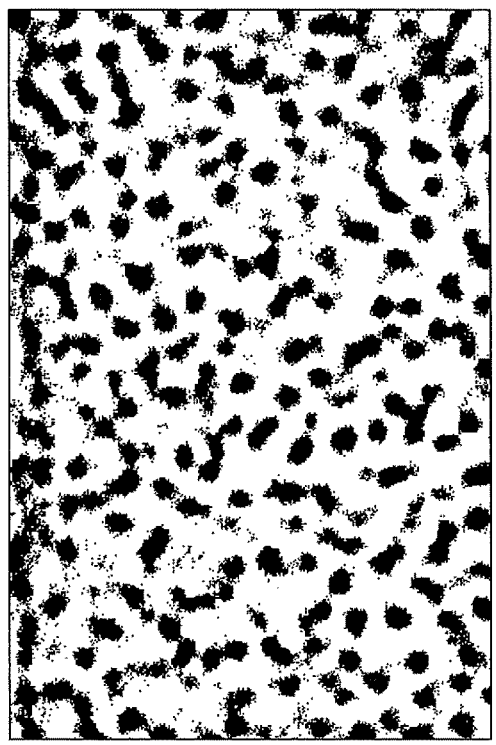

In the case of a sample No. 1 illustrated in FIG. 24A and FIG. 25A, the average of ratios each defined as (the length of a recess)/(the average width of a recess) was 1.6, which is lower than 4.0. Accordingly, the surface structure of the insulating layer of the sample No. 1 does not fit the definition of the structure having grooves as defined in the present disclosures. The recesses formed in the surface of the insulating layer of the sample No. 1 are pinhole-like recesses, and there are no long, thin grooves.

In the case of a sample No. 2 illustrated in FIG. 24B and FIG. 25B, the average of ratios each defined as (the length of a recess)/(the average width of a recess) was 4.6, which is greater than or equal to 4.0. Accordingly, the surface structure of the insulating layer of the sample No. 2 fits the definition of the structure having grooves as defined in the present disclosures. The recesses are formed in a maze shape, and have meander shapes.

Figure 25C:
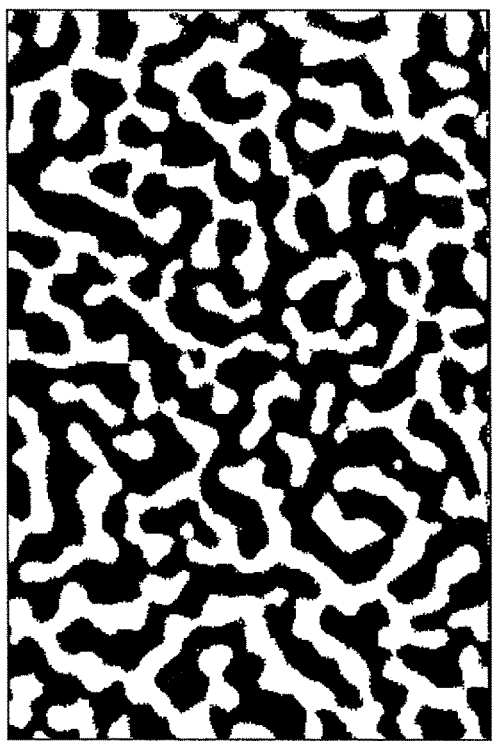

In the case of a sample No. 3 illustrated in FIG. 24C and FIG. 25C, the average of ratios each defined as (the length of a recess)/(the average width of a recess) was 18.1, which is greater than or equal to 4.0. Accordingly, the surface structure of the insulating layer of the sample No. 3 fits the definition of the structure having grooves as defined in the present disclosures. The recesses are formed in a maze shape, and have meander shapes.

In the case of a sample No. 4 illustrated in FIG. 24D and FIG. 25D, the average of ratios each defined as (the length of a recess)/(the average width of a recess) was 61.0, which is greater than or equal to 4.0. Accordingly, the surface structure of the insulating layer of the sample No. 4 fits the definition of the structure having grooves as defined in the present disclosures. The recesses are formed in a maze shape, and have meander shapes.

<Adhesion Test>

Figure 26:
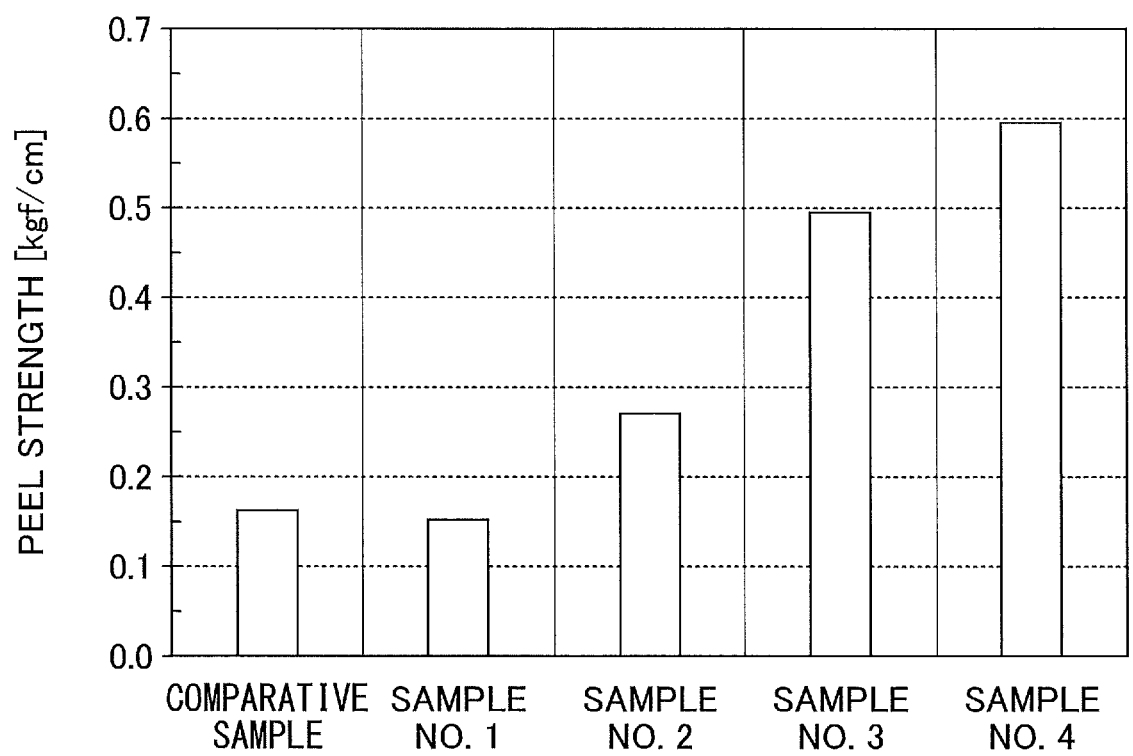
FIG. 26 is a drawing illustrating the results of 90-degree peel tests.

In the following, the results of an experiment regarding the relationships between the surface condition of an insulating layer and the adhesion to an interconnect layer will be described. In this experiment, an interconnect layer was formed on an insulating layer, and a 90-degree peel test was conducted with respect to the sample No. 1, the sample No. 2, the sample No. 3, and the sample No. 4. The insulating layer was a polyimide layer. The seed layer and the metal plating layer contained in the interconnect layer were both copper layers. Further, as a comparative sample, an interconnect layer was formed on an insulating layer that was not provided with intentional recesses on the surface thereof, and a 90-degree peel test was conducted. FIG. 26 illustrates the results.

As illustrated in FIG. 26, the sample No. 2, the sample No 3, and the sample No. 4 having meander-shape grooves exhibited a significantly high peel strength, compared to the comparative sample and the sample No. 1 having pinhole-like recesses.

<Reliability Test>

In the following, the results of a reliability tests will be described. In the reliability test, an interconnect layer was formed on an insulating layer, and a 90-degree peel test was conducted with respect to the sample No. 4 after thermal stress was applied. Further, as a first comparative sample, an interconnect layer was formed on an insulating layer that was not provided with intentional groove recesses on the surface thereof, and a 90-degree peel test was conducted after thermal stress was applied. In the sample No. 4 and the first comparative sample of the reliability test, the insulating layer was a polyimide layer, and the seed layer contained in the interconnect layer was a copper-nickel-alloy layer, with the metal plating layer contained in the interconnect layer being a copper layer. A second comparative sample was also prepared that had the same configuration as the first comparative sample, except that a copper layer was used as the seed layer. With respect to this second comparative sample, a 90-degree peel test was also conducted after thermal stress was applied.

Figure 27:
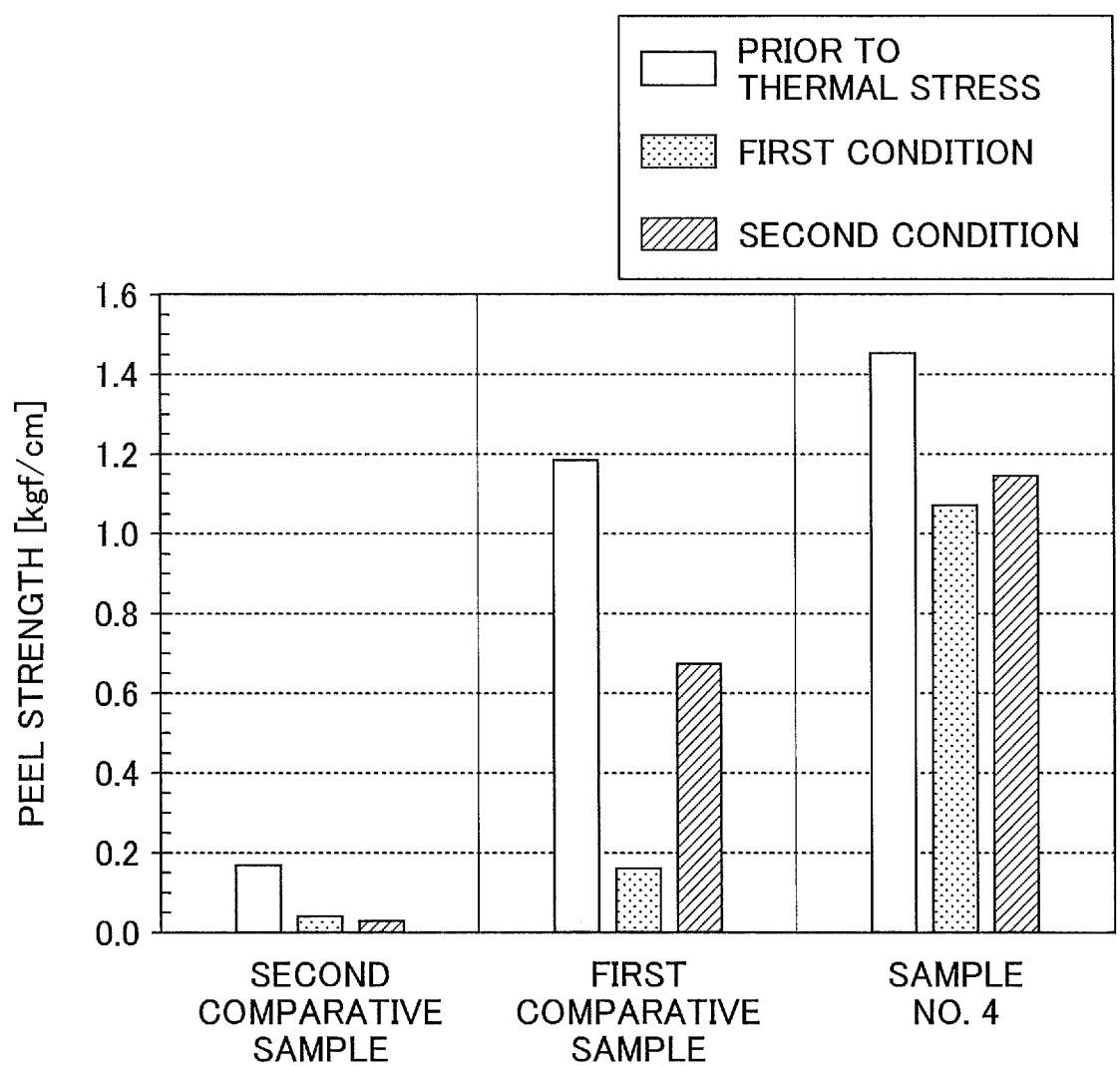
FIG. 27 is a drawing illustrating the results of reliability test.

Two types of thermal stress conditions were used. In the first condition, the sample was let to stand in the atmosphere having a temperature of 125 degrees Celsius for 24 hours, and was then let to stand in the atmosphere having a humidity of 60% RH and a temperature of 60 degrees Celsius for 40 hours, followed by performing a reflow process three times at 265 degrees Celsius. The first condition conforms to JEDEC Lv. 3A. In the second condition, the sample was let to stand in the atmosphere having a humidity of 85% RH and a temperature of 130 degrees Celsius for 100 hours. The second condition conforms to a high accelerated standard test (i.e., HAST). FIG. 27 illustrates the results.

As illustrated in FIG. 27, the first comparative sample and the sample No. 4 having a copper-nickel layer as a seed layer exhibited a good peel strength, compared to the second comparative sample having a copper layer as a seed layer. Further, the first comparative sample exhibited a reduced peel strength after thermal stress in the first condition and after thermal stress in the second condition, but the sample No. 4 exhibited only a small reduction in peel strength, with peel strength higher than or equal to 1.0 kgf/cm being maintained.

<Relationship Between Material of Masking Film and Pitch of Bulges and Openings>

Figure 28A:
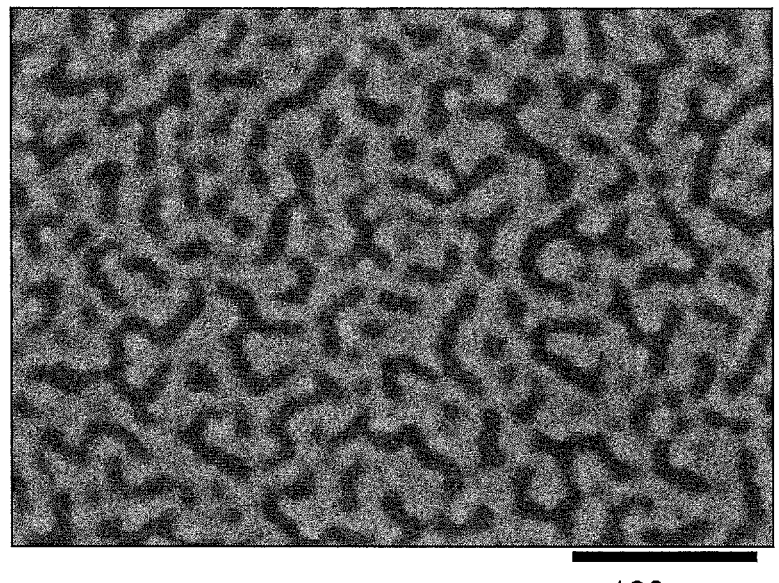
FIGS. 28A and 28B are drawings illustrating examples of SEM images of a masking film surface.
Figure 28B:
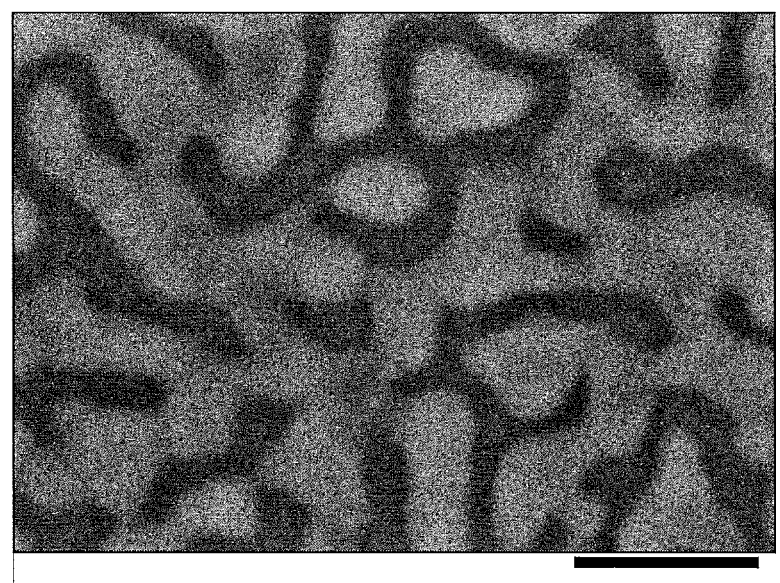
Figure 29A:
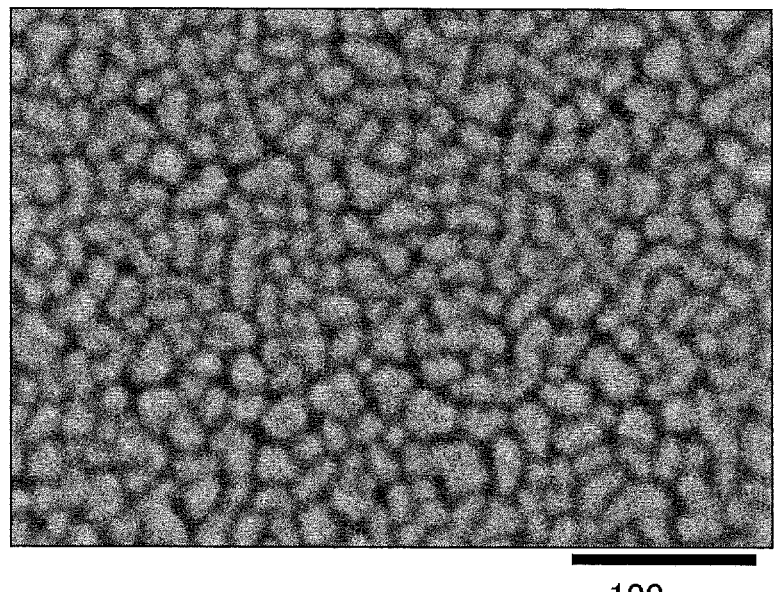
FIGS. 29A and 29B are drawings illustrating examples of SEM images of a masking film surface.
Figure 29B:
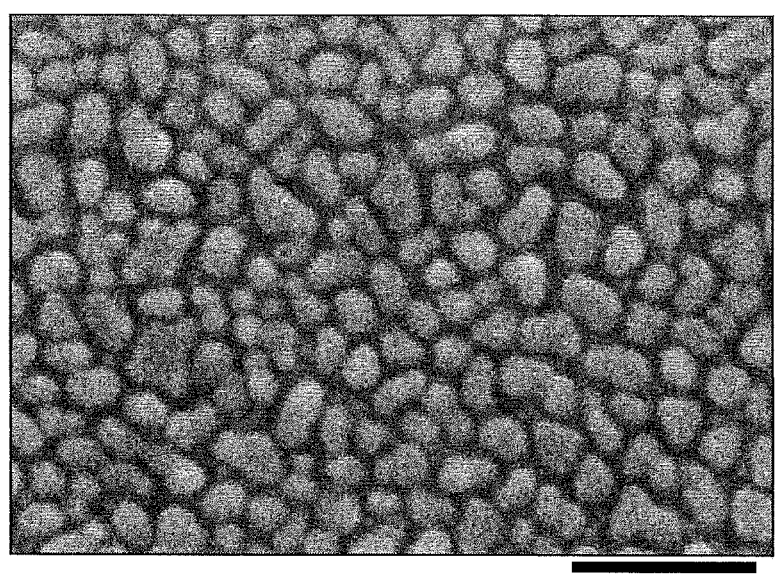

In the following, relationships between the material of a masking film and the pitch of bulges and openings will be described. FIGS. 28A and 28B and FIGS. 29A and 29B are drawings illustrating examples of SEM images of a masking film surface. FIGS. 28A and 29A illustrate examples of SEM images of a copper masking film surface, and FIGS. 28B and 29B illustrate examples of SEM images of an aluminum masking film surface. Examples in which opening are formed in a maze shape are illustrated in FIG. 28A and FIG. 28B. Examples in which openings are formed in a mesh shape are illustrated in FIGS. 29A and 29B.

As illustrated in FIGS. 28A and 28B and FIGS. 29A and 29B, the pitch of bulges and openings formed in the aluminum masking film was greater than the pitch of bulges and openings formed in the copper masking film, regardless of whether the openings are in a maze shape or in a mesh shape. Accordingly, use of an aluminum masking film allows longer-pitch grooves to be formed in the insulating layer than in the case of using a copper masking film.

According to at least one embodiment, strong adhesion between an insulating layer and an interconnect layer is provided while ensuring satisfactory transmission characteristics with respect to radio frequency signals.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

In addition to the subject matter recited in the claims, the present disclosures include aspects of the subject matter as set out non-exhaustively in the following numbered clauses.

[CLAUSE 1] A method of making an interconnect substrate, the method comprising:
a step of forming an insulating layer;
a step of forming, on a first surface of the insulating layer, a first film having first grooves on an order of nanometers in a second surface thereof facing away from the insulating layer;
a step of deepening the first grooves until the first grooves reach the insulating layer, thereby forming groove openings penetrating through the first film;
a step of forming second grooves on an order of nanometers matching the openings in the first surface by etching the insulating layer by use of the first film having the openings as a mask; and
a step of forming an interconnect layer having anchor portions fitted into the second grooves.

[CLAUSE 2] The method as claimed in clause 1, wherein the first film is formed by sputtering.

[CLAUSE 3] The method as claimed in clause 1 or 2, wherein the first grooves have a meander shape in a plan view.

[CLAUSE 4] The method as claimed in any one of clauses 1 to 3, wherein formation of the first film, formation of the openings, and formation of the second grooves are performed in a single sputtering apparatus.

[CLAUSE 5] The method as claimed in clause 4, wherein the step of forming an interconnect layer includes:
a step of forming a seed layer in the sputtering apparatus; and
a step of forming a plated metal layer on the seed layer.

[CLAUSE 6] The method as claimed in any one of clauses 1 to 4, wherein the step of forming an interconnect layer includes:
forming a seed layer by a wet process; and
forming a metal plating layer on the seed layer.

[CLAUSE 7] The method as claimed in clause 5 or 6, wherein a copper-nickel alloy layer is formed as the seed layer.

[CLAUSE 8] The method as claimed in any one of clauses 1 to 7, further a step of removing the first film between the step of forming second grooves and the step of forming an interconnect layer.

[CLAUSE 9] The method as claimed in clause 8, further comprising a step of performing plasma processing by use of nitrogen gas on the first surface between the step of removing the first film and the step of forming an interconnect layer.

[CLAUSE 10] The method as claimed in clause 8 or 9, wherein the first film is removed by wet etching.

[CLAUSE 11] The method as claimed in any one of clauses 1 to 10, wherein a step of etching a surface layer of the insulating layer having the second grooves exposed outside the interconnect layer after the step of forming an interconnect layer.

[CLAUSE 12] The method as claimed in clause 11, further comprising a step of forming third grooves on an order of nanometers in a portion of the insulating layer exposed outside the interconnect layer after the step of etching a surface layer.

[CLAUSE 13] The method as claimed in any one of clauses 1 to 12, wherein an aluminum or zinc film is formed as the first film.

What is claimed is:

1. An interconnect substrate, comprising:
an insulating layer; and
an interconnect layer formed on part of an upper surface of the insulating layer,
wherein the upper surface of the insulating layer has grooves formed therein, the grooves having a meander shape in a plan view, an average width of the grooves being greater than or equal to 1 nm and less than 100 nm,
wherein the interconnect layer has anchor portions fitted into the grooves,
wherein the upper surface of the insulating layer includes a first area covered with the interconnect layer and a second area not covered with the interconnect layer, and
wherein the upper surface of the insulating layer in the first area protrudes above the upper surface of the insulating layer in the second area.

2. The interconnect substrate as claimed in claim 1, wherein an average pitch of the grooves is greater than or equal to 10 nm and less than or equal to 100 nm.

3. The interconnect substrate as claimed in claim 1, wherein an average width of the grooves is greater than or equal to 3 nm and less than or equal to 50 nm.

4. The interconnect substrate as claimed in claim 1, wherein the upper surface of the insulating layer has a surface structure such that when an average of ratios each defined as (a length of a groove)/(an average width of the groove) is calculated over the grooves existing on the upper surface, the average of ratios is greater than or equal to 4.0.

5. The interconnect substrate as claimed in claim 1, wherein a ratio of areas of the grooves to an area of the upper surface is greater than or equal to 10 area% and less than or equal to 60 area%.

6. The interconnect substrate as claimed in claim 1, wherein an average depth of the grooves is greater than or equal to 10 nm and less than or equal to 50 nm.

7. The interconnection substrate as claimed in claim 1, wherein the interconnect layer includes:
a seed layer made of a copper-nickel alloy formed on the upper surface of the insulating layer, the grooves being filled with the seed layer; and
a metal plating layer formed on the seed layer.

8. The interconnection substrate as claimed in claim 1, wherein the upper surface of the insulating layer in the second area is a flat surface.

9. The interconnection substrate as claimed in claim 1, further comprising another insulating layer that covers a surface of the interconnect layer and the upper surface of the insulating layer in the second area.

10. An interconnect substrate, comprising:
an insulating layer; and
an interconnect layer formed on a surface of the insulating layer,
wherein the surface of the insulating layer has grooves formed therein, the grooves having a meander shape in a plan view, an average width of the grooves being greater than or equal to 1 nm and less than 100 nm,
wherein the interconnect layer has anchor portions fitted into the grooves, and
wherein the interconnect layer includes:
a seed layer made of a copper-nickel alloy formed on the surface of the insulating layer, the grooves being filled with the seed layer; and
a metal plating layer formed on the seed layer.

* * * * *